(12) United States Patent
Li et al.

(10) Patent No.: US 11,665,987 B2
(45) Date of Patent: May 30, 2023

(54) INTEGRATED SWITCH USING STACKED PHASE CHANGE MATERIALS

(71) Applicant: International Business Machines Corporation, Armonk, NY (US)

(72) Inventors: Juntao Li, Cohoes, NY (US); Kangguo Cheng, Schenectady, NY (US); Dexin Kong, Slingerlands, NY (US); Zheng Xu, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 97 days.

(21) Appl. No.: 17/192,223

(22) Filed: Mar. 4, 2021

(65) Prior Publication Data

US 2022/0285614 A1    Sep. 8, 2022

(51) Int. Cl.
*H10N 70/00* (2023.01)
*G11C 13/00* (2006.01)

(52) U.S. Cl.
CPC ..... *H10N 70/8413* (2023.02); *G11C 13/0004* (2013.01); *H10B 63/30* (2023.02); *H10N 70/023* (2023.02); *H10N 70/063* (2023.02); *H10N 70/068* (2023.02);
(Continued)

(58) Field of Classification Search
CPC ... H01L 45/126; H01L 27/2436; H01L 45/06; H01L 45/14; H01L 45/1616; H01L 45/1675; H01L 45/1691; G11C 13/0004; G11C 2013/008; H10N 70/8413; H10N 70/023; H10N 70/063; H10N 70/068; H10N 70/231; H10N 70/881; H10N 70/8613; H10N 70/8828; H10N 70/823; H10B 63/30
See application file for complete search history.

(56) References Cited

U.S. PATENT DOCUMENTS 7,579,616 B2   8/2009   Chen
9,257,647 B2   2/2016   Borodulin
9,419,213 B2   8/2016   Raieszadeh
(Continued)

OTHER PUBLICATIONS

Cohen et al., "Integrated Circuit Security Using Programmable Switches", U.S. Appl. No. 17/114,706, filed Dec. 8, 2020, 33 Pages
(Continued)

*Primary Examiner* — Jerome Leboeuf
(74) *Attorney, Agent, or Firm* — Edward J. Wixted, III

(57) ABSTRACT

An approach to form a semiconductor structure with a multiple layer phase change material stack and four electrodes that functions as an integrated switch device. The semiconductor structure includes a sidewall spacer that is on two opposing sides of the multiple layer phase change material stack contacting an edge of each layer of the multiple layer phase change material stack. The semiconductor structure includes a pair of a first type of electrode, where each of the pair of the first type of electrode abuts each of the sidewall spacers on the two opposing sides of the multiple layer phase change material stack. A pair of a second type of electrode, where each of the second type of electrode abuts each of two other opposing sides of the multiple layer phase change material stack and contacts a heater material on outside portions of the multiple layer phase change material stack.

19 Claims, 29 Drawing Sheets

(52) U.S. Cl.
 CPC ......... *H10N 70/231* (2023.02); *H10N 70/881* (2023.02); *G11C 2013/008* (2013.01)

(56) References Cited

U.S. PATENT DOCUMENTS

| | | | |
|---|---|---|---|
| 9,647,209 | B2 | 5/2017 | Goktepeli |
| 9,934,922 | B2 | 4/2018 | Reig |
| 10,164,608 | B2 | 12/2018 | Belot |
| 2012/0236627 | A1* | 9/2012 | Koh .................... G11C 11/5678 365/148 |
| 2014/0145140 | A1* | 5/2014 | Kim ...................... H01L 45/085 257/4 |
| 2020/0006646 | A1* | 1/2020 | Cheng .................... H01L 45/06 |
| 2020/0058862 | A1* | 2/2020 | Howard .................. H01L 45/16 |
| 2021/0320250 | A1* | 10/2021 | Heiss ................... H01L 45/126 |

OTHER PUBLICATIONS

Cohen et al., "Memory Device Having Separate Programming and Resistance Readout Control", App No. U.S. Appl. No. 16/529,021, filed Aug. 1, 2019, 35 Pages.

El-Hinnawy et al., "A Four-Terminal, Inline, Chalcogenide Phase-Change RF Switch Using an Independent Resistive Heater for Thermal Actuation," IEEE Electron Device Letters, vol. 34, No. 10, Oct. 2013, pp. 1-3.

Gorbenko et al., "Resistance Drift and Crystallization in Suspended and On-oxide Phase Change Memory Line Cells," IEEE 19th International Conference on Nanotechnology (IEEE-NANO), Jul. 22-26, 2019, pp. 1-4.

\* cited by examiner

INTEGRATED SWITCH USING STACKED PHASE CHANGE MATERIALS

BACKGROUND OF THE INVENTION

The present invention relates generally to the field of semiconductor device manufacture and more particularly to the formation of an integrated switch using stacked phase change materials.

Phase change materials include various chalcogenide glass materials that can be used in semiconductor device applications, such as phase change random access memory (PCRAM) and radio frequency (RF)switches. A phase change material typically has at least two solid phases, a crystalline state, and an amorphous state. The transformation between these two phases typically can be achieved by changing the temperature of the phase change material above a transition temperature of the phase change material using electrical heating or through optical pulses.

In the amorphous state, the phase change material exhibits a higher resistivity than in the crystalline state. In typical semiconductor switch applications, such as highly integrated radio frequency (RF) switches, when the phase change material is in a low resistivity crystalline state, the switch is in an "ON" state and transmits signals, such as RF signals. Similarly, in typical semiconductor switch applications, when the phase change material is in a highly resistive amorphous state, the switch is in an "OFF" state and does not transmit signals. A phase change material, in a typical semiconductor application, may switch between numerous electrically detectable conditions of varying resistivities within a nanosecond time scale with the input of pico joules of energy.

SUMMARY

Embodiments of the present invention disclose a semiconductor structure with a multiple layer phase change material stack and four electrodes that function as an integrated switching device. The semiconductor structure includes a multiple layer phase change material stack that is on a portion of a dielectric material on a semiconductor substrate. The semiconductor structure includes a sidewall spacer that is on two opposing sides of the multiple layer phase change material stack contacting an edge of each layer of the multiple layer phase change material stack. Furthermore, the semiconductor structure includes a pair of a first type of electrode, wherein each of the pair of the first type of electrode abuts each of the sidewall spacers on the two opposing sides of the multiple layer phase change material stack and a pair of a second type of electrode, wherein each of the pair of the second type of electrode abuts each of two other opposing sides of the multiple layer phase change material stack and contacts a heater material on outside portions of the multiple layer phase change material stack.

Embodiments of the present invention provide a method of forming a switching device with stacked phase change materials. The method includes forming a stack of multiple alternating layers of a phase change material where the stack of alternating layers includes alternating layers of an insulator material, a heater material, the insulator material, and the phase change material covered by another layer of the insulator material, another layer of the heater material, a top layer of the insulator material. The method includes the stack having a first pair of sidewalls and a second pair of sidewalls. Furthermore, the method includes forming a conductive sidewall spacer on each side of the first pair of sidewalls and laterally etching a portion of exposed edges of each layer of the phase change material in the stack of alternating layers on the second pair of sidewalls. The method includes forming a dielectric material that fills notches created by removal of a portion of each layer of the phase change material during the lateral etch. The method includes forming a first pair of electrodes with each electrode abutting the conductive spacer and forming a second pair of electrodes abutting the second pair of sidewalls.

BRIEF DESCRIPTION OF THE DRAWINGS

The above and other aspects, features, and advantages of various embodiments of the present invention will be more apparent from the following description taken in conjunction with the accompanying drawings.

DETAILED DESCRIPTION

Figure 1:
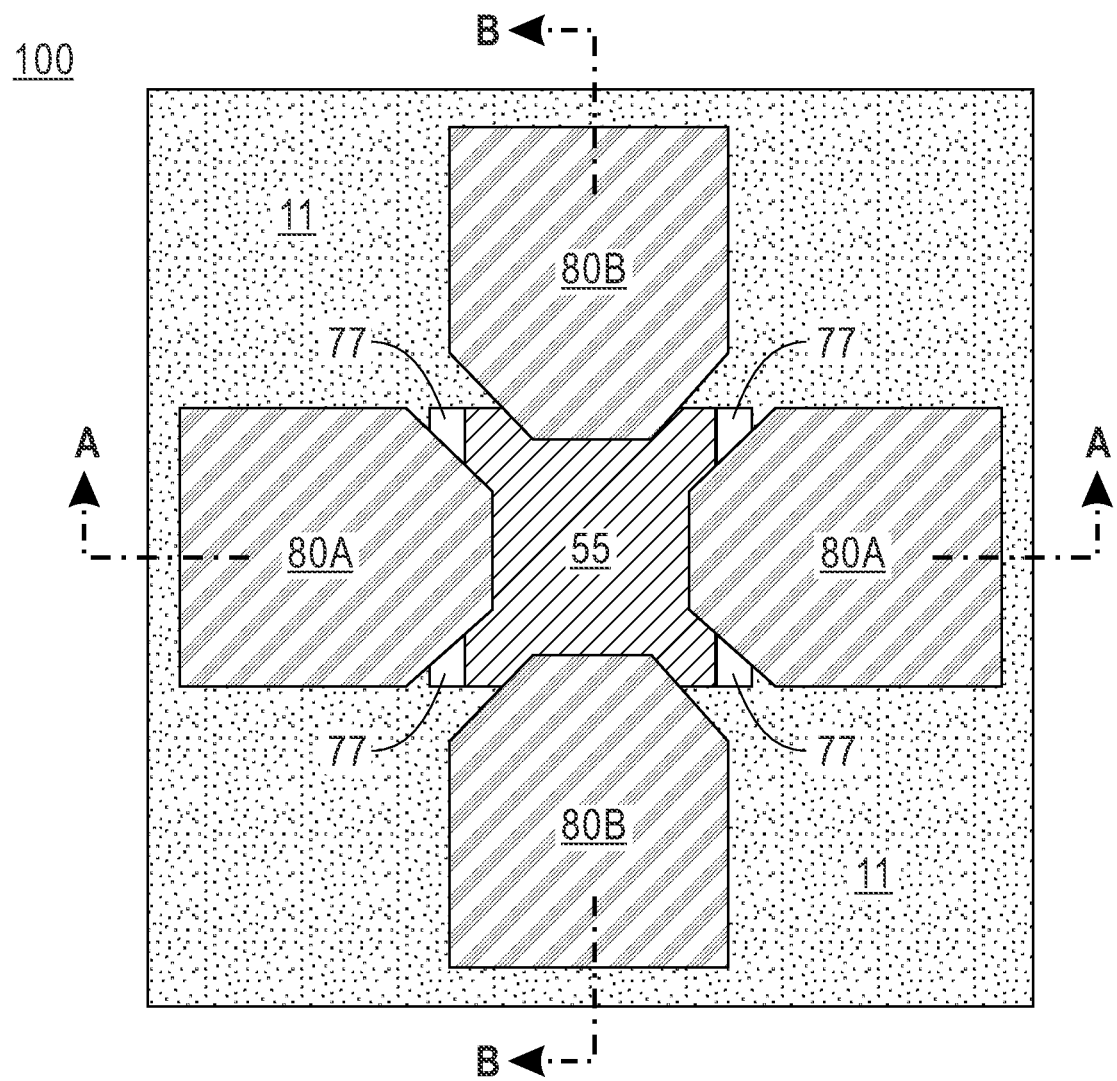
FIG. 1 depicts a top view of a semiconductor structure illustrating locations of section A-A and section B-B with heater and switch electrodes, in accordance with an embodiment of the present invention.

Embodiments of the present invention recognize that phase change materials are increasingly used in semiconductor switches. In particular, embodiments of the present invention recognize that for highly integrated RF switches, the use of phase change materials provides a lower "ON" state resistance, lower gate voltages, easier integration with complementary-symmetry metal-oxide-semiconductor (CMOS) devices, and CMOS manufacturing processes.

Embodiments of the present invention recognize that an improvement of the rate of heating and cooling of the heater element for the PCM is needed to improve semiconductor device and chip application device functionality. Embodiments of the present invention recognize that an ability of a heater element to efficiently and uniformly provide a thermal energy transfer to the phase change materials for a faster state change in the PCM is desirable, especially, to improve switching speeds in the semiconductor chip.

Embodiments of the present invention recognize that in typical semiconductor memory applications using phase change materials, a heating element may extend into a phase transition material and create a mushroom-shaped phase transition portion of the phase change material. Embodiments of the present invention recognize that for switching devices, switching speed improvements are desirable. Semiconductor device structures providing more efficient and faster ways to heat up or to quench the phase change material in the PCM for phase change transitions to and from the low resistance crystalline state of the PCM are desirable for improving switching speed in semiconductor devices utilizing phase change materials.

Embodiments of the present invention provide semiconductor structures and a method of forming the semiconductor structures that provide faster, more efficient ways to achieve a low resistivity, crystalline atomic structure or phase in the phase change material of the PCM. Embodiments of the present invention provide a method of forming several PCM cells joined in parallel to improve thermal transfer to the PCM cells. The PCM cells joined in parallel with multiple heater elements provide a more uniform and efficient thermal energy transfer to each of the PCM cells for a faster and more efficient device switching. Embodiments of the present invention provide several methods of forming PCM cells surrounded by heater elements that are joined in parallel. Using PCM cells surrounded by heater elements can also decrease the on-state resistance of the completed semiconductor chip.

Embodiments of the present invention provide a semiconductor structure of a switch device with four electrodes. One pair of the four electrodes connect to a number of heater elements or heater layers and maybe called heater electrodes. Each heater electrode connects to one or more heater elements that can provide thermal energy to change the state of the phase change material. For the purposes of the present invention, each of these two electrodes connecting to one or more heater elements is called a heater electrode.

Embodiments of the present invention provide a second pair of the four electrodes that each connect through a metal sidewall spacer to the multiple phase change material layers. The second pair of electrodes that transmit the signals, such as a radio frequency signal through the phase change material layers can be called switch electrodes for the purposes of the present invention. The two switch electrodes connect through the metal sidewall spacer to the multiple phase change material layers to transmit signals when the phase change material is in an amorphous state and to not transmit signals when the phase change material is in a crystalline state. The two heater electrodes directly connect to multiple layers of heater material and the two switch electrodes are closely coupled or connect through the metal sidewall spacer to the multiple layers of the phase change material.

Embodiments of the present invention provide a semiconductor structure where the heater electrode directly connects to each heater layer and each heater layer is separated from each phase change material layer by a thin insulator layer. Using multiple PCM cells, with each PCM cell composed of a phase change material layer that is surrounded by a thin insulating layer with a heater layer above and below the thin insulating layer, provides more uniform and rapid heating (and quenching) of the phase change material layers. The two heater electrodes directly connect to each heater layer. In this way, the semiconductor device structures of the present invention provide more uniform and more efficient switching for highly integrated RF switches.

Embodiments of the present invention provide a method of depositing a phase change material stack for a PCM composed of multiple alternating layers of insulating materials, heater materials, and phase change materials surrounded by a spacer and covered by a hardmask material. The stack of deposited materials in the phase change material or PCM stack can be etched to form a rectangular structure. The method includes etching edge portions of the layers of the heater material on one side of the PCM stack, for example, along the exposed edges in the B-B direction or along the Y axis direction in a conventional orthogonal X-Y plane of a top down view. The method includes depositing a layer of a dielectric material where the heater material was removed and forming a sidewall spacer around the PCM material stack.

A second etch of the PCM material stack after metal sidewall spacer formation exposes two sides of the rectangular PCM material stack in the A-A direction and then, laterally a portion of each exposed edge of each of the phase change material layers and depositing an electrically isolating material with good thermal conductivity along the exposed edges of the PCM layers.

The two switch electrodes are formed directly contacting the metal sidewall spacer that separates the phase change material phase change material from the two switch electrodes. In this way, a good electrical connection between the switch electrodes and the phase change material layers can occur. The two switch electrodes are formed by depositing and patterning of a dummy electrode material and replacing the dummy electrode material with an electrode material forming the two switch electrodes.

The method further includes forming a pair of heater electrodes directly connecting the exposed edges of each layer of the heater material by depositing, patterning of a dummy electrode material and then, replacing the dummy electrode material with an electrode material forming the two heater electrodes.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. Some of the process steps, depicted, can be combined as an integrated process step. In addition, descriptions of well-known functions and constructions may be omitted for clarity and conciseness.

The terms and words used in the following description and claims are not limited to the bibliographical meanings, but, are merely used to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces unless the context clearly dictates otherwise.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" or "contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Detailed embodiments of the claimed structures and methods are disclosed herein. The method steps described below do not form a complete process flow for manufacturing integrated circuits on semiconductor chips. The present embodiments can be practiced in conjunction with the integrated circuit fabrication techniques for semiconductor chips and devices currently used in the art, and only so much of the commonly practiced process steps are included as are necessary for an understanding of the described embodiments. The figures represent cross-section portions of a semiconductor chip or a substrate, such as a semiconductor wafer during fabrication and are not drawn to scale, but instead are drawn to illustrate the features of the described embodiments. Specific structural and functional details disclosed herein are not to be interpreted as limiting, but merely as a representative basis for teaching one skilled in the art to variously employ the methods and structures of the present disclosure. In the description, details of well-known features and techniques may be omitted to avoid unnecessarily obscuring the presented embodiments.

References in the specification to "one embodiment", "other embodiment", "another embodiment", "an embodiment," etc., indicate that the embodiment described may include a particular feature, structure or characteristic, but every embodiment may not necessarily include the particular feature, structure or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure, or characteristic in connection with other embodiments whether or not explicitly described.

Reference will now be made in detail to the embodiments of the present invention, examples of which are illustrated in the accompanying drawings, wherein like reference numerals refer to like elements throughout.

FIG. 1 depicts a top view of semiconductor structure 100 illustrating locations of section A-A and section B-B with switch electrodes 80A and heater electrodes 80B, in accordance with an embodiment of the present invention. FIG. 1 depicts a top view of semiconductor structure 1000A in FIG. 10A which is a cross-sectional view through section A-A of the PCM stack and the two switch electrodes 80A of a first embodiment of the present invention and a top view of semiconductor structure 1000B in FIG. 10B that is a cross-sectional view through section B-B of the PCM stack and the two heater electrodes 80B of the first embodiment of the present invention. As depicted, FIG. 1 includes insulation layer 11, hardmask (HM) 55, spacers 77, switch electrodes 80A, and heater electrodes 80B. In semiconductor structure 100, section A-A bisects the two switch electrodes 80A, and section B-B bisects the two heater electrodes 80B. Switch electrodes 80A and heater electrodes 80B are depicted as six-sided electrodes that can extend over a portion of HM 55. As depicted in FIG. 1, heater electrodes 80B do not contact spacer 77 or switch electrodes 80A (e.g., for semiconductor device functionality). In other examples, switch electrodes 80A and heater electrodes 80B may extend over more or less of HM 55 or may not be on HM 55. In an embodiment, some or all of switch electrodes 80A and heater electrodes 80B have a four-sided shape. In this case, the width of heater electrodes 80B can be less than the distance between spacer 77 on each of the two opposing sides of HM 55.

Figure 2:
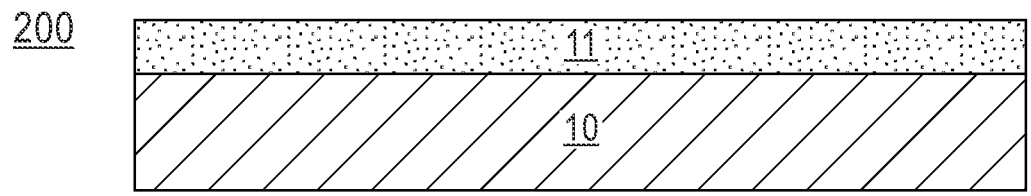
FIG. 2 depicts a cross-sectional view of section A-A of the semiconductor structure after depositing a dielectric layer on a semiconductor substrate, in accordance with an embodiment of the present invention.

FIG. 2 depicts a cross-sectional view of section A-A of semiconductor structure 200 after depositing dielectric layer 11 on substrate 10, in accordance with an embodiment of the present invention. As depicted, FIG. 2 includes substrate 10 and dielectric layer 11. Substrate 10 may be composed of any semiconductor substrate material. For example, substrate 10 can be composed of a silicon substrate, a group IV semiconductor material, a group III-V semiconductor material, a group II-VI semiconductor material, a silicon on insulator (SOI), or other known semiconductor material used in semiconductor chips. In various embodiments, substrate 10 is a wafer or a portion of a wafer.

Dielectric layer 11 resides on substrate 10. Dielectric layer 11 can be a layer of a dielectric material, deposited with known deposition processes. For example, dielectric layer 11 can be composed of silicon nitride (SiN) deposited by chemical vapor deposition (CVD) or another known semiconductor deposition process. In other examples, dielectric layer 11 may be another dielectric material, such as silicon dioxide ($SiO_2$), another oxide or another nitride dielectric material.

Figure 3:
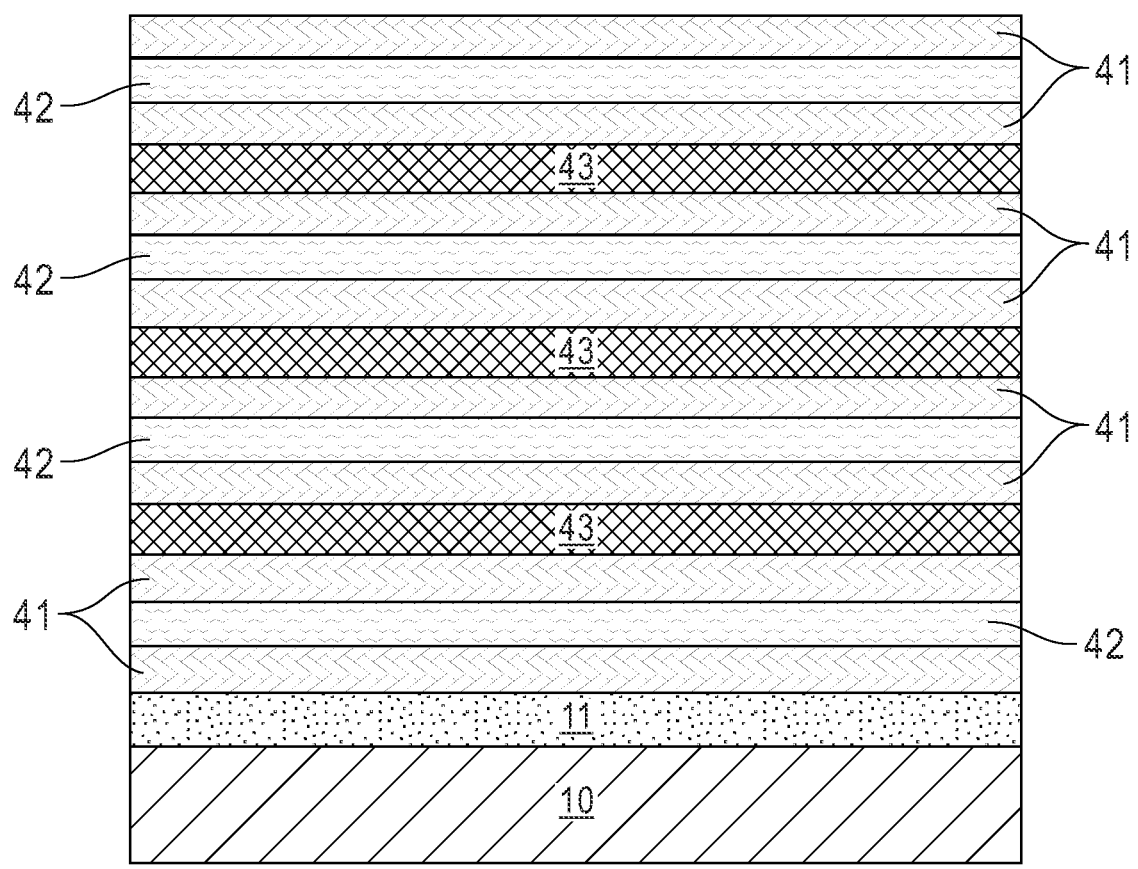
FIG. 3 depicts a cross-sectional view of section A-A of the semiconductor structure after depositing layers of materials for an insulator/heater/insulator/PCM multilayer stack, in accordance with an embodiment of the present invention.

FIG. 3 depicts a cross-sectional view of section A-A of semiconductor structure 300 after depositing multiple layers of materials for an insulator/heater/insulator/PCM multi-layer stack, in accordance with an embodiment of the present invention. As depicted, FIG. 3 includes substrate 10, dielectric layer 11, multiple alternating layers of insulator 41, heater 42, and PC 43. For the purposes of discussion of the present invention, each the stack of layers of insulator 41/heater 42/insulator 41/PC 43 forms a single PCM cell or stack. As depicted in FIG. 3, the three PCM cells are covered with insulator 41, heater 42, and insulator 41 on the top of the three PCM cells. Each of the layers of the PCM cells may be deposited with known deposition processes, such as chemical vapor deposition (CVD), plasma vapor deposition (PVD), atomic layer deposition (ALD), etc. While FIG. 3 depicts three PCM cells topped with a layer of insulator 41, heater 42 and a last layer of insulator 41, in other embodiments, any number of PCM cells can be present. For example, one, two or four or more PCM cells covered with another heater 42 that is surrounded by layers of insulator 41 may be deposited on dielectric layer 11.

As depicted, the first layer of insulator 41 can be deposited on dielectric layer 11. Each layer of insulator 41 can be a thin layer of an electrically insulating material that is thermally conductive. For example, insulator 41 can be aluminum nitride (AlN), hexagonal boron nitride, or a similar material providing good thermal conduction to and from heater 42 and also providing electrical isolation between heater 42 and PC 43. The thickness of the layers of insulator 41 can range from 5 nanometers (nm) to 20 nm but is not limited to this range.

A layer of material for heater 42 can be deposited on insulator 41. Heater 42 can be composed of any material used as heaters for semiconductor device phase change material applications. For example, heater 42 may be composed of titanium nitride (TiN), tantalum nitride (TaN), or other similar resistive metal material which can provide large joule heating during the phase change material transition from a high resistivity amorphous structure to a low resistivity crystalline structure. In the multilayer stack depicted in FIG. 3, each layer of heater 42 is surrounded by a layer of insulator 41. In the multilayer stack in FIG. 3, a layer of insulator 41 is both above and below each layer of heater 42.

After depositing the first layer of heater 42 covered by insulator 41, the first layer of a phase change material (PC) 43 is deposited on the second layer of insulator 41. PC 43 may be composed of any known phase change material used in semiconductor chip applications. For example, PC 43 may be composed of tellurium-based materials including germanium tellurium (GeTe) or germanium-antimony-tellurium (GST), but not limited to these materials. Alternatively, other suitable materials for the phase change material include Si—Sb—Te (silicon-antimony-tellurium) alloys, Ga—Sb—Te (gallium-antimony-tellurium) alloys, Ge—Bi—Te (germanium-bismuth-tellurium) alloys, In—Se (indium-tellurium) alloys, As—Sb—Te (arsenic-antimony-tellurium) alloys, Ag—In—Sb—Te (silver-indium-antimony-tellurium) alloys, Ge—In—Sb—Te alloys, Ge—Sb alloys, Sb—Te alloys, Si—Sb alloys, and combinations thereof. PC 43 may be undoped or doped (e.g., doped with one or more of O, N, Si, or Ti). In some embodiments, the phase change material can be doped with dielectric materials including but not limited to aluminum oxide ($Al_2O_3$), silicon oxide (SiO$_2$), tantalum oxide (Ta$_2$O$_5$), hafnium oxide (HfO$_2$), zirconium oxide (ZrO$_2$), cerium Oxide (CeO$_2$), silicon nitride (SiN), silicon oxynitride (SiON), etc.

As depicted in FIG. 3, each layer of phase change material (PC) 43 is deposited on a layer of insulator 41 and is covered by a layer of insulator 41. In some embodiments, the thickness of PC 43 ranges from 50 nm to 200 nm. Thickness greater than 100 nm or less than 50 nm is also conceived. In other embodiments, the thickness of PC 43 is greater than 200 nm. As depicted in FIG. 3, the third layer of insulator 41 is deposited on PC 43.

As depicted in FIG. 3, two more layers of PC 43 are deposited with each layer of PC 43 surrounded by a thin layer of insulator 41. As discussed above, a layer of heater 42 can be deposited above each layer of insulator 41 and covered by another layer of insulator 41. In other embodiments, two or more layers of PC 43 with surrounding layers of insulator 41 with heater 42 can be deposited.

Figure 4:
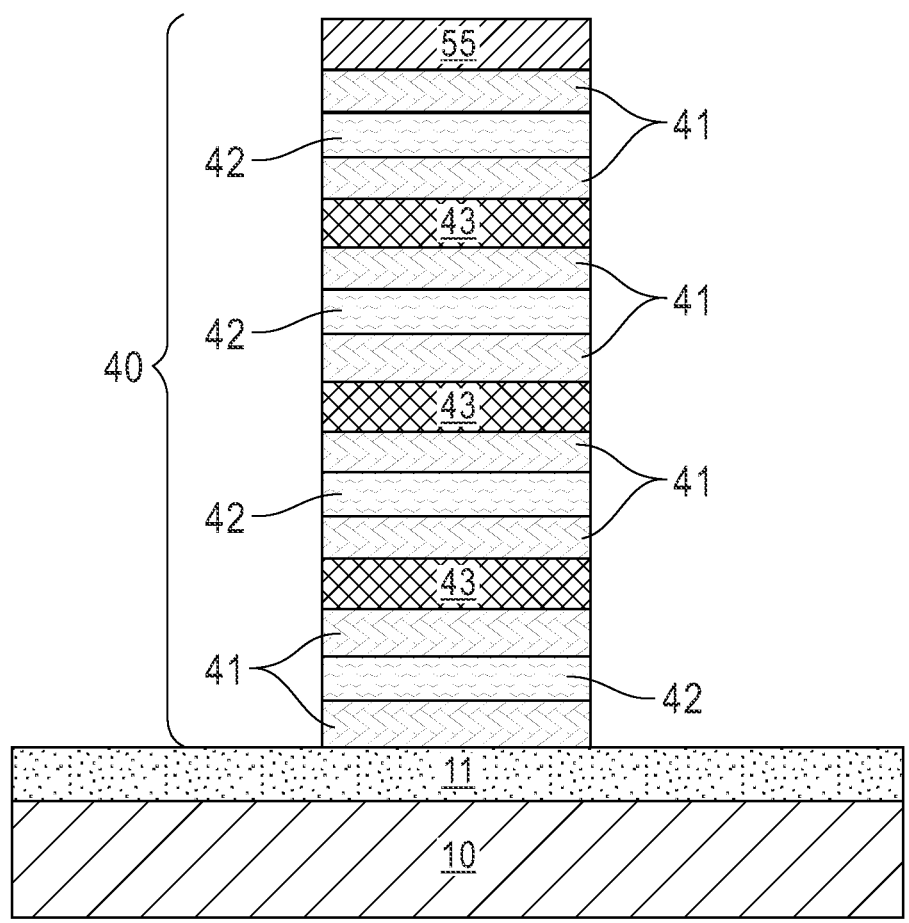
FIG. 4 depicts a cross-sectional view of section A-A of the semiconductor structure after etching the insulator/heater/insulator/PCM multilayer stack, in accordance with an embodiment of the present invention.

FIG. 4 depicts a cross-sectional view of section A-A of semiconductor structure 400 after etching the PCM multilayer stack, in accordance with an embodiment of the present invention. As depicted, FIG. 4 includes PCM multilayer stack 40 composed of multiple alternating layers of insulator 41, heater 42, PC 43 covered by another layer of insulator 41, heater 42, insulator 41 and hardmask (HM) 55 after a selective etch forming PCM multilayer stack 40.

A layer of a hardmask material, such as but limited to SiN, can be deposited on the top layer of insulator 41 as hardmask (HM) 55. For example, using photolithography, patterning of the top surface of HM 55, an etch of PCM multilayer stack 40 may occur. An etch process, such as a reactive ion etch (RIE), can selectively remove portions of the layers to form PCM multilayer stack 40. After etching, a rectangular portion of PCM multilayer stack 40 remains. In various embodiments, the shape and size of PCM stack 40 vary depending on the functionality requirements of the semiconductor switch device and chip.

Figure 5:
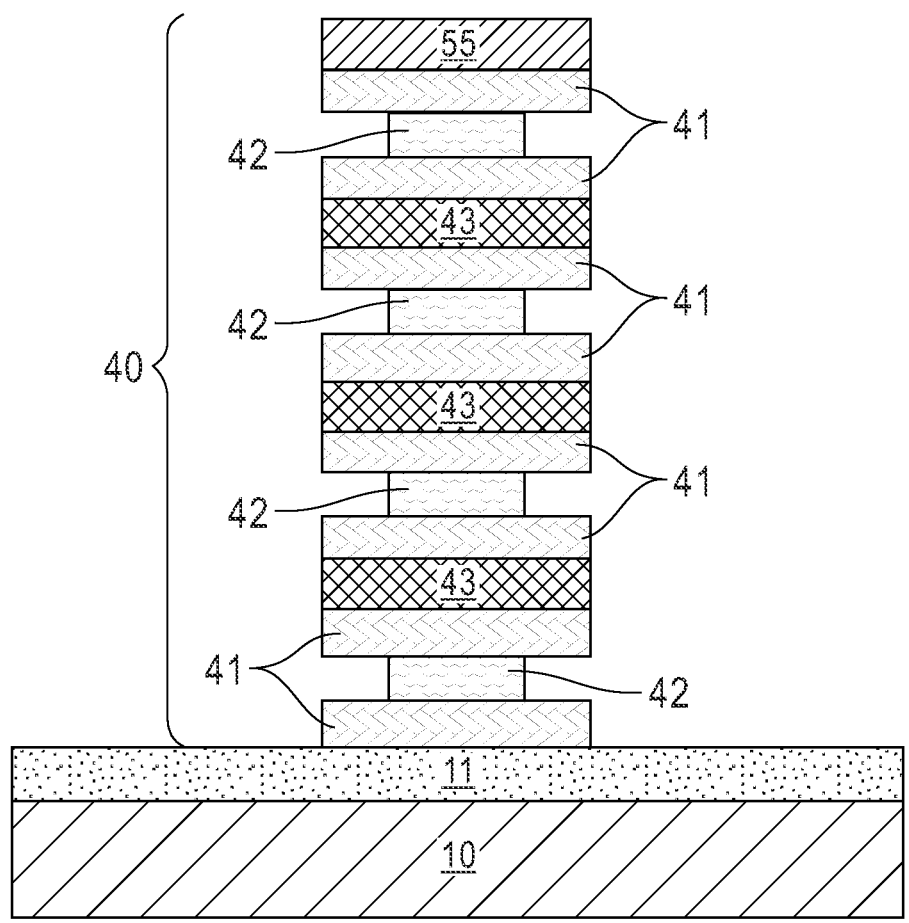
FIG. 5 depicts a cross-sectional view of section A-A of the semiconductor structure after laterally etching the edges of each heater layer, in accordance with an embodiment of the present invention.

FIG. 5 depicts a cross-sectional view of section A-A of semiconductor structure 500 after laterally etching the edges of each layer of heater 42, in accordance with an embodiment of the present invention. Using a wet or dry etch process, a lateral etch of the edges of each layer of heater 42 can occur. The lateral etch process can create notches or indentations in PCM multilayer stack 40 where the outer edges of each layer of heater 42 are removed. For example, the lateral etching of each heater 42 may create a notch which can extend 20 nm to 50 nm into PCM multilayer stack 40. In other examples, the lateral etch can create notches with different dimensions that may be larger or smaller than 20 nm to 50 nm and may vary in width according to different thickness of heater 42 layers.

Figure 6:
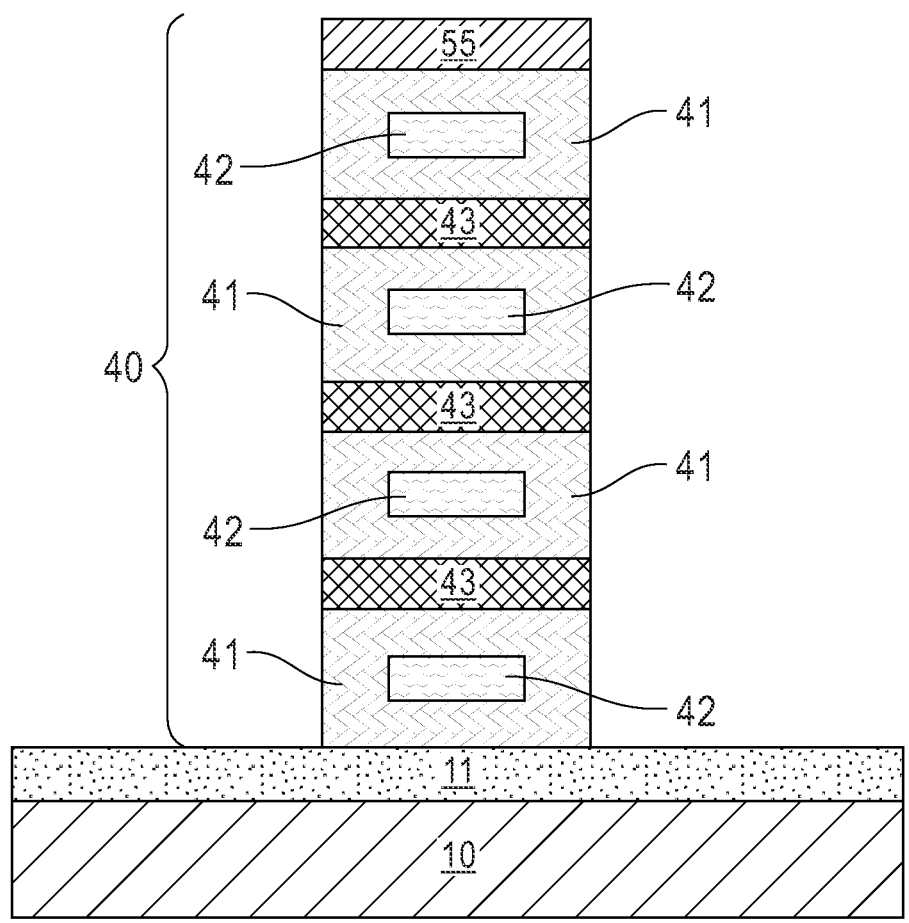
FIG. 6 depicts a top view of the semiconductor structure after conformal dielectric material deposition and etch back to form a metal sidewall, in accordance with an embodiment of the present invention.

FIG. 6 depicts a cross-sectional view of section A-A of semiconductor structure 600 after conformal dielectric material deposition and etch back, in accordance with an embodiment of the present invention. In various embodiments, the conformal deposition of the dielectric material is a conformal deposition of insulator 41. The conformal deposition of insulator 41 results in the filling of the notches in PCM multilayer stack 40. Insulator 41 fills in the notches or portions of PCM multilayer stack 40 where the edge of each layer of heater 42 was removed during the lateral etch process previously discussed with respect to FIG. 5.

After conformal deposition of insulator 41, a patterning and etch process, such as RIE may be performed to remove portions of insulator 41 deposited on the sides of PCM multilayer stack 40 and surface of dielectric layer 11. The etch back of insulator 41 exposes the outside edges of PC 43 in PCM multilayer stack 40, the outside edges of HM 55, and the vertical sides of insulator 41 in PCM multilayer stack 40. In semiconductor structure 600, each remaining portion or segment of heater 42 is surrounded by a thin layer of insulator 41.

Figure 7:
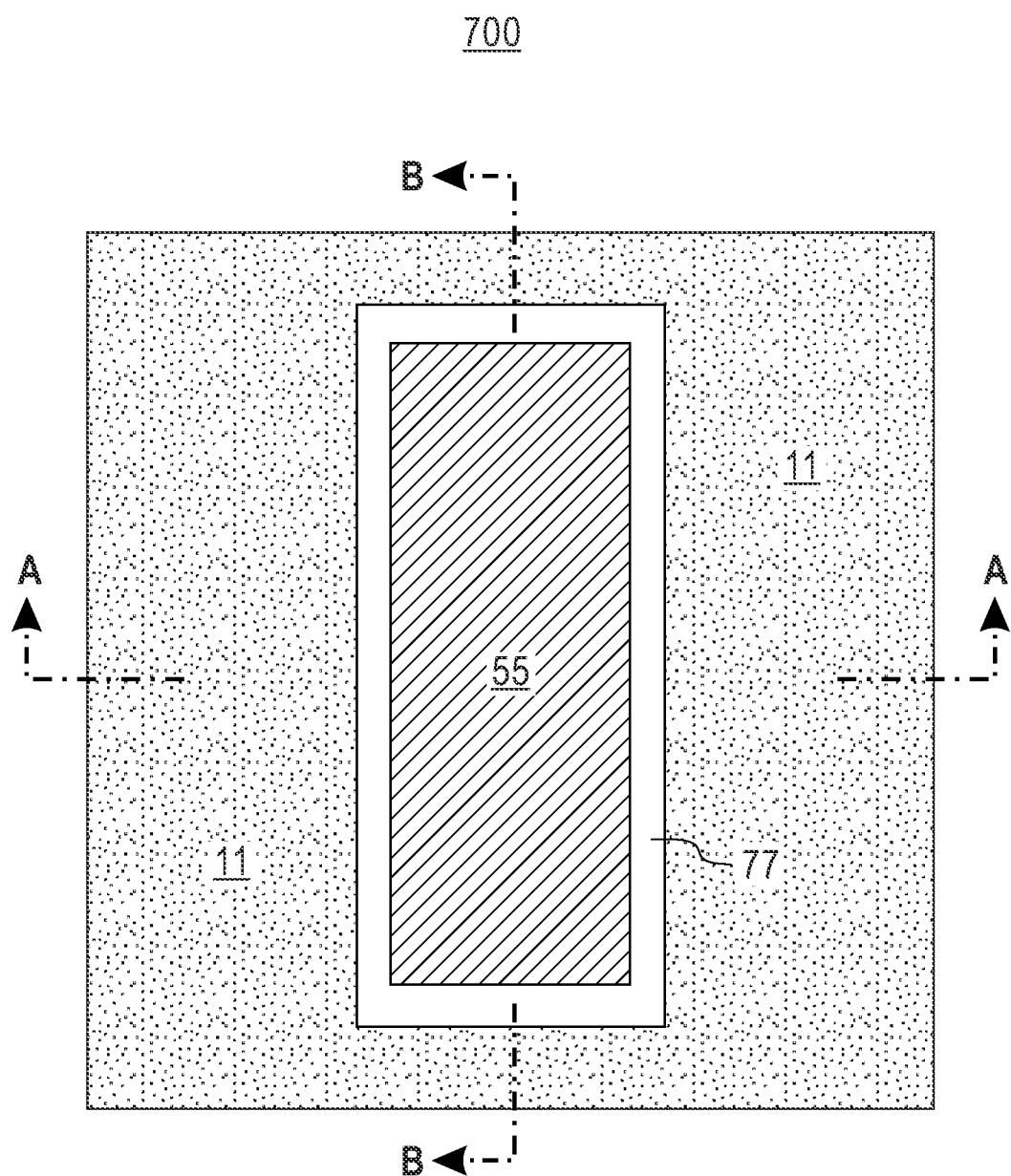
FIG. 7 depicts a top view of the semiconductor structure after depositing a metal sidewall, in accordance with an embodiment of the present invention.

FIG. 7 depicts a top view of semiconductor structure 700 after depositing spacer 77, in accordance with an embodiment of the present invention. As depicted, FIG. 7 includes dielectric layer 11, HM 55, and spacer 77. As depicted in FIG. 7, a top view of the rectangular top surface of HM 55 on PCM multilayer stack 40 that is surrounded by spacer 77. The size and shape of rectangular PCM multilayer stack 40 surrounded by spacer 77 can be different in other examples. Spacer 77 can be formed with known metal sidewall spacer formation processes. For example, a layer of a metal sidewall material can be deposited around the sides of PCM multilayer stack 40 and on semiconductor structure 700 using known metal sidewall spacer materials. An isotropic etch, such as RIE, can remove the metal sidewall spacer material from horizontal surfaces of semiconductor structure 700 (e.g., from HM 55, dielectric layer 11) to form spacer 77. In various embodiments, an electrically conductive spacer material forms spacer 77, such as TiN, TaN, and tungsten. Non-limiting thickness of the spacer 77 ranges from 5-10 nm.

Figure 7A:
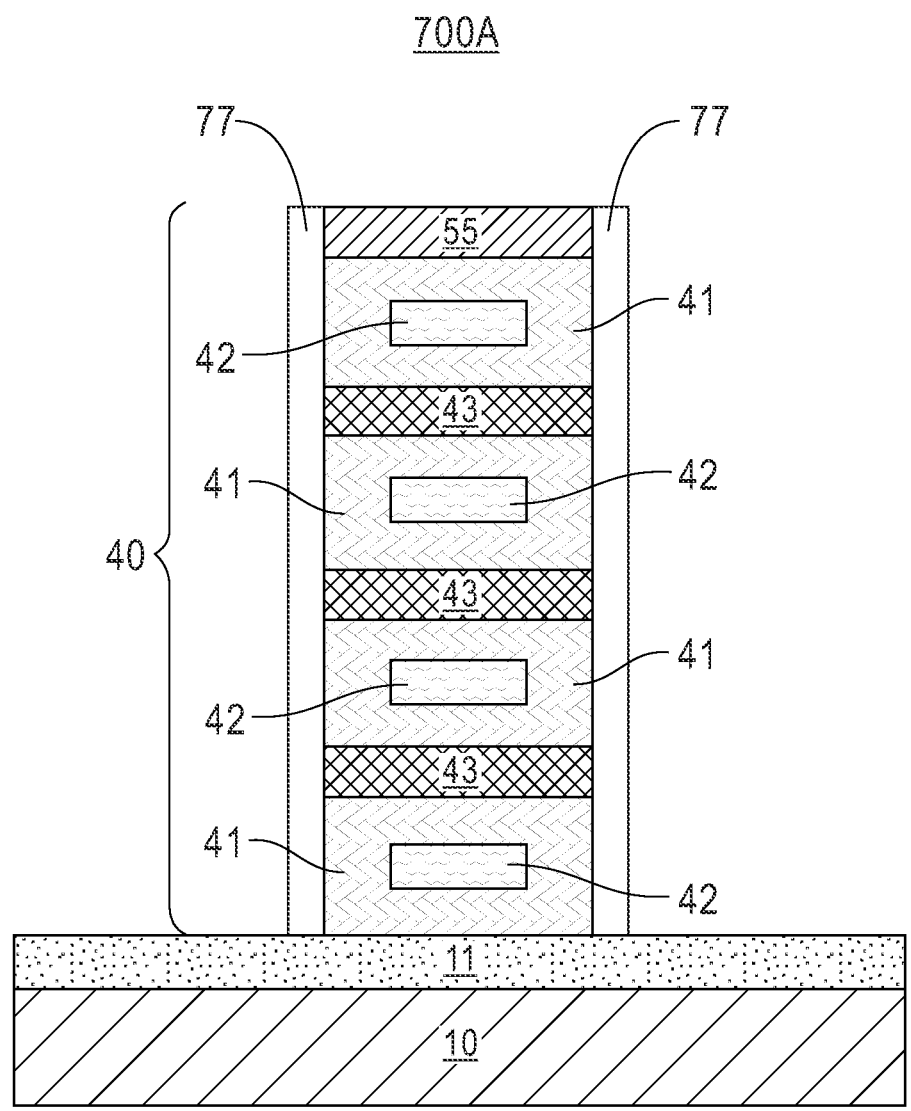
FIG. 7A depicts a cross-sectional view of section A-A of the semiconductor structure after metal sidewall spacer deposition, in accordance with an embodiment of the present invention.

FIG. 7A depicts a cross-sectional view of section A-A of semiconductor structure 700A after spacer 77 deposition, in accordance with an embodiment of the present invention. As depicted, FIG. 7A includes PCM multilayer stack 40 on dielectric layer 11 with spacer 77 surrounding the vertical sides of PCM multilayer stack 40. Using known metal sidewall spacer formation processes discussed above, spacer 77 can be formed as depicted.

Figure 8:
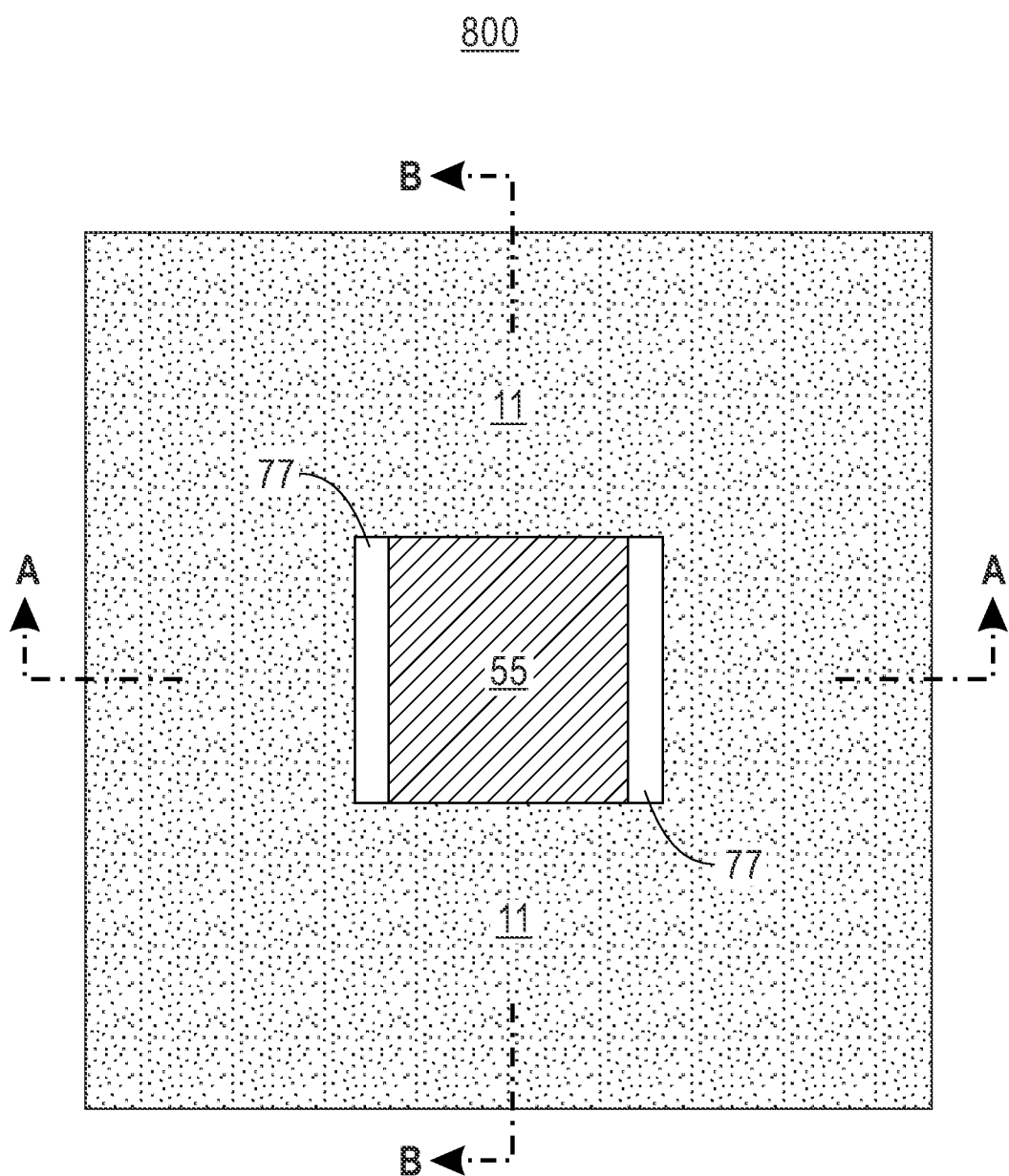
FIG. 8 depicts a top view of the semiconductor structure after etching a portion of the PCM multilayer stack, in accordance with an embodiment of the present invention.

FIG. 8 depicts a top view of semiconductor structure 800 after etching a portion of PCM multilayer stack 40, in accordance with an embodiment of the present invention. As depicted, FIG. 8 includes dielectric layer 11, a top surface of PCM multilayer stack 40, and a top surface of spacer 77 after etching PCM multilayer stack 40. After patterning PCM multilayer stack 40 and etching two end portions of PCM multilayer stack 40 and spacer 77 surrounding the two end portions of PCM multilayer stack 40, a smaller rectangular portion of PCM multilayer stack 40 remains. The size and shape of the remaining portion of PCM multilayer stack 40 may be different in other examples.

After completing the patterning and etch of PCM multilayer stack 40, spacer 77 remains on two opposing sides of PCM multilayer stack 40 and the other opposing two sides of PCM multilayer stack 40 have two ends that are exposed or are not covered by spacer 77. As depicted in FIG. 8, the top and bottom ends of PCM multilayer stack 40 with spacer 77 have been removed.

Figure 8A:
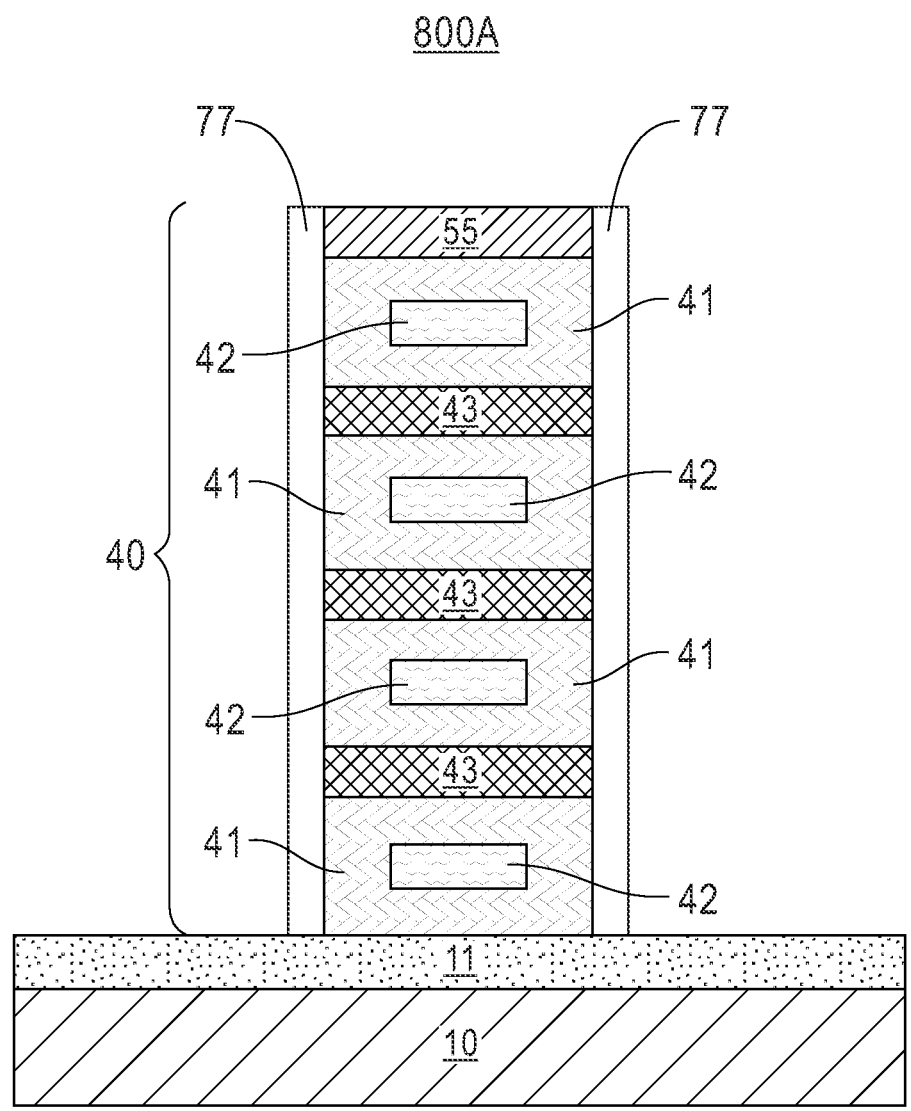
FIG. 8A depicts a cross-sectional view of section A-A of the semiconductor structure after etching the portion of the PCM multilayer stack, in accordance with an embodiment

FIG. 8A depicts a cross-sectional view of section A-A of semiconductor structure 800A after etching the portion of PCM multilayer stack 40, in accordance with an embodiment of the present invention. As depicted, FIG. 8A includes the remaining portion of PCM multilayer stack 40 with spacer 77. Each of the two spacer 77 on opposite sides of PCM multilayer stack 40 contacts the horizontal edges of HM 55, insulator 41, PC 43, and resides on a portion of dielectric layer 11.

Figure 9:
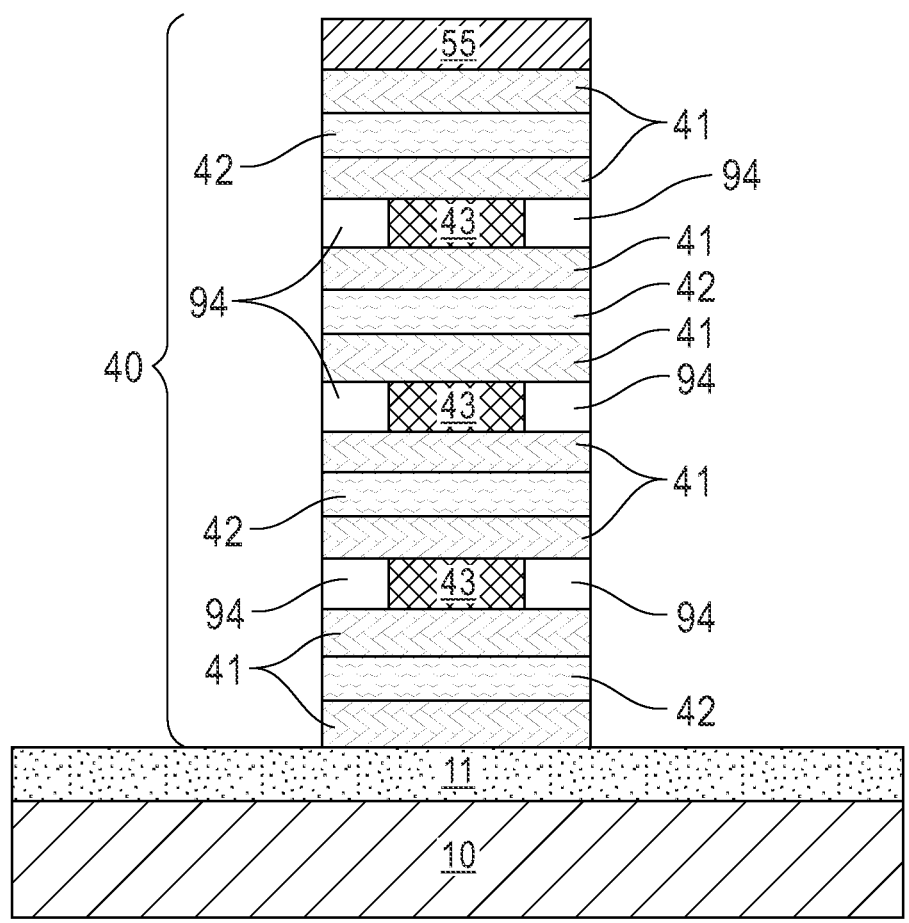
FIG. 9 depicts a cross-sectional view of section B-B of the semiconductor structure 900 after laterally etching each layer of the phase change material and conformally depositing a dielectric material, in accordance with an embodiment of the present invention.

FIG. 9 depicts a cross-sectional view of section B-B of semiconductor structure 900 after laterally etching each layer of PC 43 and conformally depositing a dielectric material, in accordance with an embodiment of the present invention. As depicted, FIG. 9 includes PCM multilayer stack 40 on dielectric layer 11 with dielectric 94 in PCM multilayer stack 40 adjacent to each end of PC 43 in section B-B. The lateral etch of each layer of PC 43 removes exposed end portions of PC 43. The end portions of PC 43 covered by spacer 77, as depicted in FIG. 8A, are not removed.

After the lateral isotropic etch of PC 43, a conformal deposition of dielectric 94 fills the notches in PCM multilayer stack 40 created by the lateral etch of PC 43. In various embodiments, dielectric 94 is composed of SiN but is not limited to this dielectric material. After the deposition of dielectric 94, a etch process, such as RIE, can remove excess dielectric 94 from the sides of PCM multilayer stack 40 and surface of dielectric layer 11 leaving essentially straight, vertical sides on PCM multilayer stack 40. As depicted in FIG. 9, PC 43 is surrounded on top and bottom by insulator 41 and on right and left sides by dielectric 94.

In some embodiments, the lateral etching of PC 43 and deposition of dielectric 94 does not occur. As previously stated, the shape of the phase change material segments formed from the layers of PC 43 can be different. As depicted, each segment or portion of a layer of PC 43 can be a thin rectangular shape or in other embodiments, the segment or portion of each PC 43 layer can be thick forming a square-like or symmetrical PC 43 segment in PCM multilayer stack 40. When the segments of PC 43 are thin rectangles, the phase change material in the top and bottom layers of PC 43 may transition first, however, when the segments of PC 43 are square-like or more symmetrical, such as circular shape, then, the lateral etch and dielectric 94 fill may not be required.

Figure 10A:
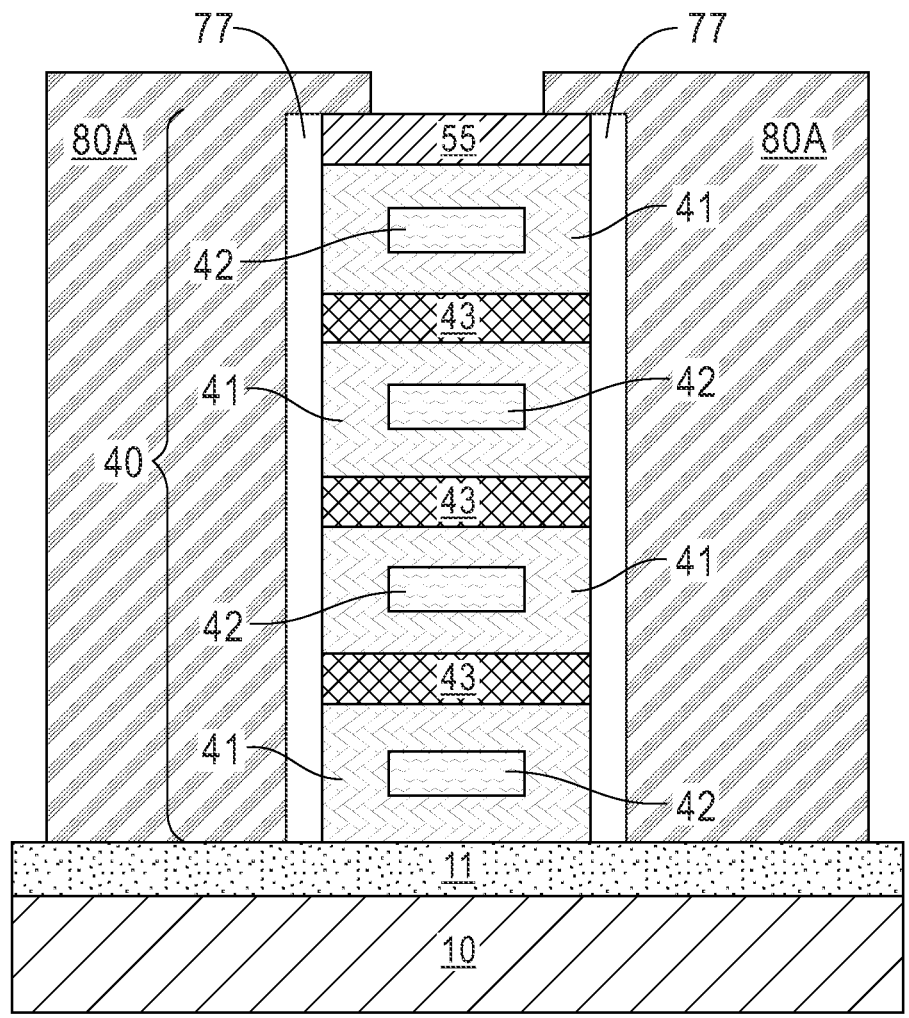
FIG. 10A depicts a cross-sectional view of section A-A of the semiconductor structure after depositing a layer of an electrode material and patterning the electrode material, in accordance with an embodiment of the present invention.

FIG. 10A depicts a cross-sectional view of section A-A of semiconductor structure 1000A after depositing a layer of the electrode material and patterning the electrode material, in accordance with an embodiment of the present invention. As depicted, FIG. 10A includes PCM multilayer stack 40 with spacer 77 and switch electrodes 80A each on dielectric layer 11. FIG. 10A is the A-A cross-sectional view of semiconductor structure 100 depicted in FIG. 1.

In various embodiments, a layer of a semiconductor device electrode material, such as but not limited to TiN Al, W, Cu, TaN, or other suitable electrode material, is deposited over semiconductor structure 1000A and selectively etched to form switch electrodes 80A and heater electrodes 80B (as depicted in FIG. 1). As depicted in FIG. 10A, switch electrode 80A is electrically isolated from heater 42 by insulator 41 but, can electrically connect through spacer 77 to each layer of PC 43. As depicted, a portion of each of switch electrodes 80A extends over a portion of HM 55. In FIG. 10A, each of switch electrodes 80A directly abuts or contacts spacer 77 and the inside wall of each of the two metal sidewall spacer (i.e., spacer 77) contact the side edges of HM 55, the side edges of each layer of PC 43, and the outside edges of insulator 41 surrounding each segment or remaining portion of each layer of heater 42.

Figure 10B:
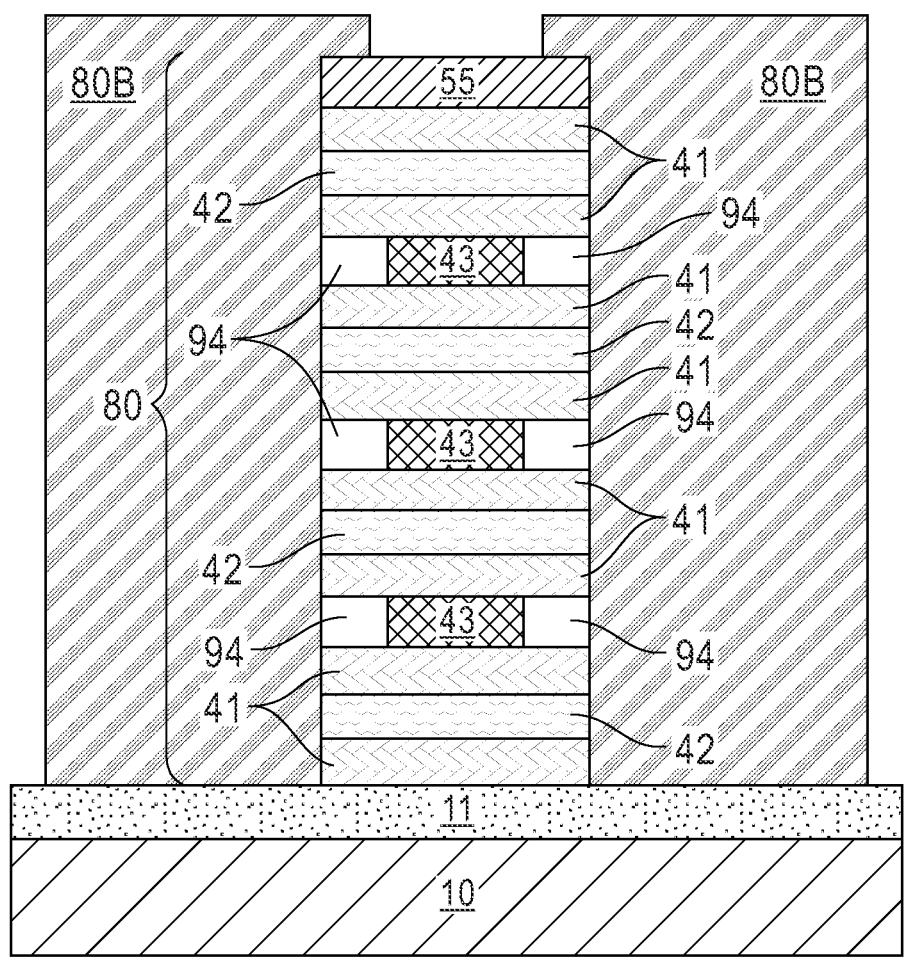
FIG. 10B depicts a cross-sectional view of section B-B of the semiconductor structure after depositing a layer of the electrode material and patterning the electrode material, in accordance with an embodiment of the present invention.

FIG. 10B depicts a cross-sectional view of section B-B of semiconductor structure 1000B after depositing a layer of the electrode material and patterning the electrode material, in accordance with an embodiment of the present invention. As depicted, FIG. 10B includes PCM multilayer stack 40 with spacer 77 and heater electrodes 80B residing on dielectric layer 11. A portion of heater electrodes 80B can reside on a portion of HM 55. FIG. 10B is the B-B cross-sectional view of semiconductor structure 100 depicted in FIG. 1. In section B-B, FIG. 10B depicts heater electrodes 80B contacting opposing ends or sides of each layer of heater 42, the sides of each portion of insulator 41, the sides of each layer of dielectric 94, the sides of spacer 77. In this way, heater electrode 80B connects to each layer of heater 42 to initiate a phase change or transition in PC 43.

When PC 43 is heated to a phase transition temperature (e.g., approximately 500 to 750 degrees Celsius depending upon the phase change material) by the thermal energy provided by heater 42 and heater electrodes 80B, PC 43 transitions into a low resistance crystalline state (e.g., PC 43 with a crystalline atomic structure with a resistance in the range of $10^4$ to $10^7$ ohms). For example, in a radio frequency (RF) switch with PCM multilayer stack 40, when each layer of heater 42 provides enough thermal energy to initiate the crystalline structure in PC 43, the low resistance phase or low resistance crystalline atomic structure of PC 43 is used to transmit the RF signals (e.g., the RF switch is in an "ON" state). Alternatively, in the RF switch, when heater electrodes 80B and heater 42 do not generate enough thermal energy to transition PC 43 into the crystalline structure, PC 43 remains in a high resistivity amorphous structure. In this case, the RF switch does not transmit a signal and the RF switch is in an "OFF" state (i.e., switch electrodes 80A are "OFF"). In other words, when heater electrode 80B provides enough energy to transition PC 43 to a low resistivity phase or a crystalline state then, switch electrode 80A is "ON" and switch electrodes 80A can transmit signals, such as an RF signal.

A top view of the semiconductor structures 1000A and 1000B was previously presented in FIG. 1. FIG. 1 depicts a top surface of both switch electrode 80A and heater electrode 80B along with the portions of dielectric layer 11, HM 55 and spacer 77 exposed after the selective etch of the electrode material to form switch electrode 80A (depicted in FIG. 10A and FIG. 1) and heater electrode 80B (depicted in FIG. 10B and FIG. 1).

Figure 11:
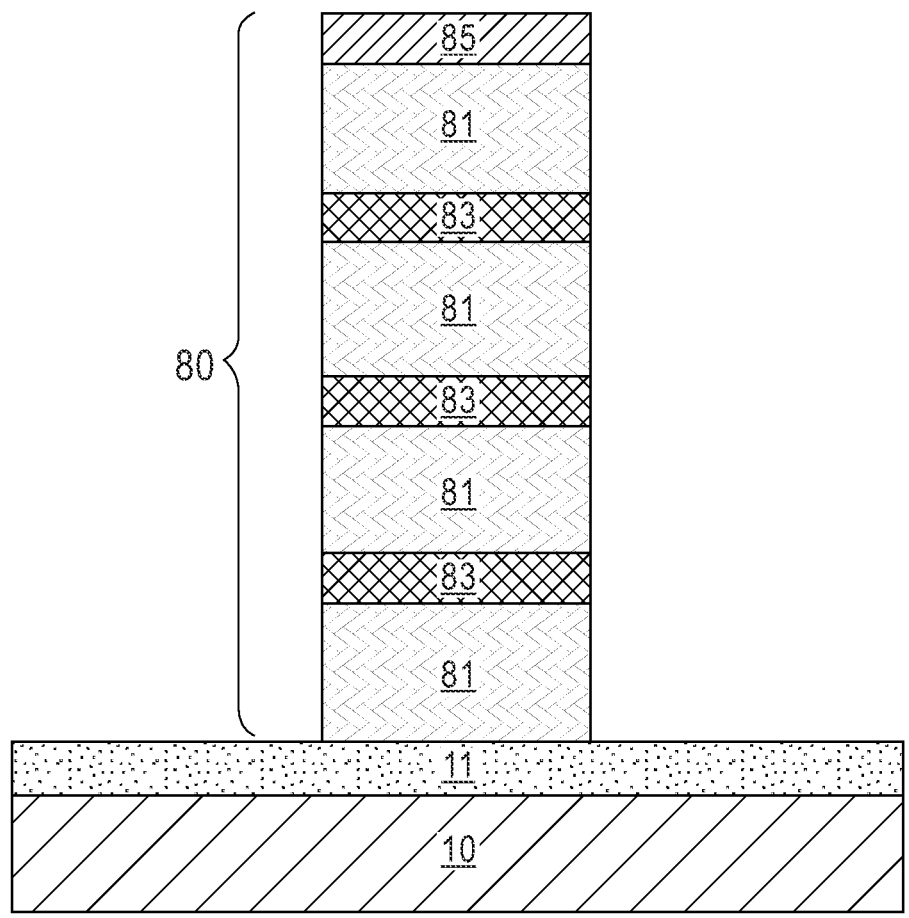
FIG. 11 depicts a cross-sectional view of section A-A of a semiconductor structure after patterning multiple alternating layers of a sacrificial material and a phase change material, in accordance with a second embodiment of the present invention.

FIG. 11 depicts a cross-sectional view of section A-A of semiconductor structure 1100 after patterning multiple alternating layers of sacrificial material 81 and phase change material (PC) 83, in accordance with a second embodiment of the present invention. As depicted, FIG. 11 includes hardmask (HM) 85, and alternating layers of phase change material (PC 83), and sacrificial material 81 on dielectric layer 11 that is above substrate 10. Each layer of PC 83 is surrounded above and below by a layer of sacrificial material 81. While three layers of PC 83 are depicted in FIG. 11, any number of layers of PC 83 may be present in semiconductor structure 1100.

PC 83 can be any phase change material for a semiconductor application, such as but, not limited to GeTe or GST. A thickness of PC 43 may vary depending upon the semiconductor device or chip application. Sacrificial material 81 can be any suitable sacrificial material, such as SiN or the like. Hardmask 85 can be deposited on the last layer of sacrificial material 81 and may be any hardmask material used in semiconductor chip applications. The alternating layers of sacrificial material 81 and PC 83 covered by HM 85 are depicted as stack 80. In various embodiments, HM 85 is patterned, for example using photolithography, and stack 80 is etched. For example, an RIE etch may remove vertical portions of stack 80. As depicted in FIG. 11, the selective etch of stack 80 leaves a rectangular portion of stack 80. The size and shape of the remaining portion of stack 80 can be different in other embodiments.

Figure 12:
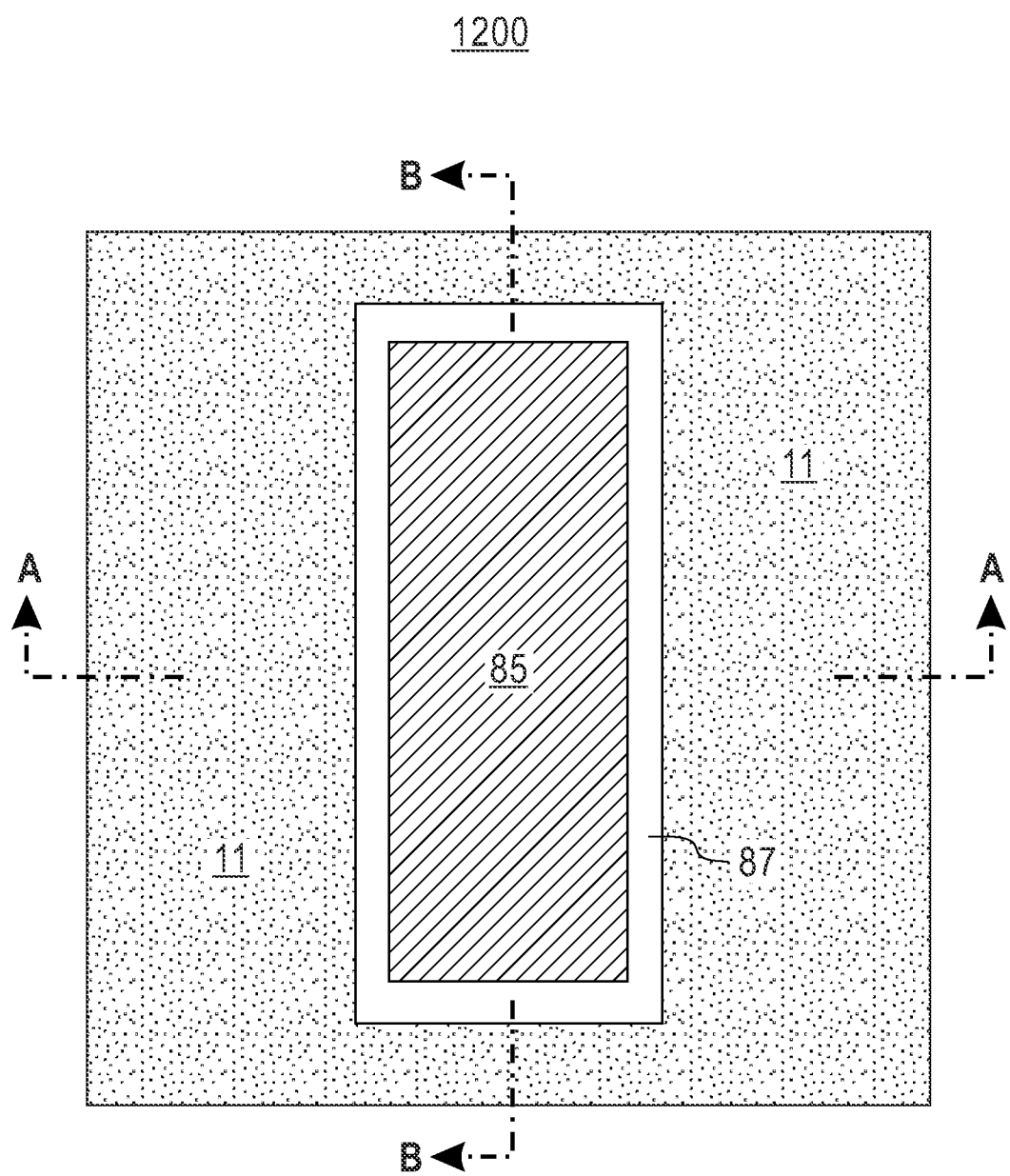
FIG. 12 depicts a top view of the semiconductor structure after etching a portion of the PCM multilayer stack, in accordance with an embodiment of the present invention.

FIG. 12 depicts a top view of semiconductor structure 1200 after depositing spacer 87 around stack 80, in accordance with an embodiment of the present invention. As depicted, FIG. 12 includes HM 85, spacer 87, and dielectric layer 11. Spacer 87 surrounds the edges of the top surface of HM 85. Spacer 87 may be composed of any metal sidewall spacer material and may be formed with similar or the same spacer formation processes as spacer 77. Spacer 87 may be the same spacer material or a different spacer material than spacer 77.

Figure 12A:
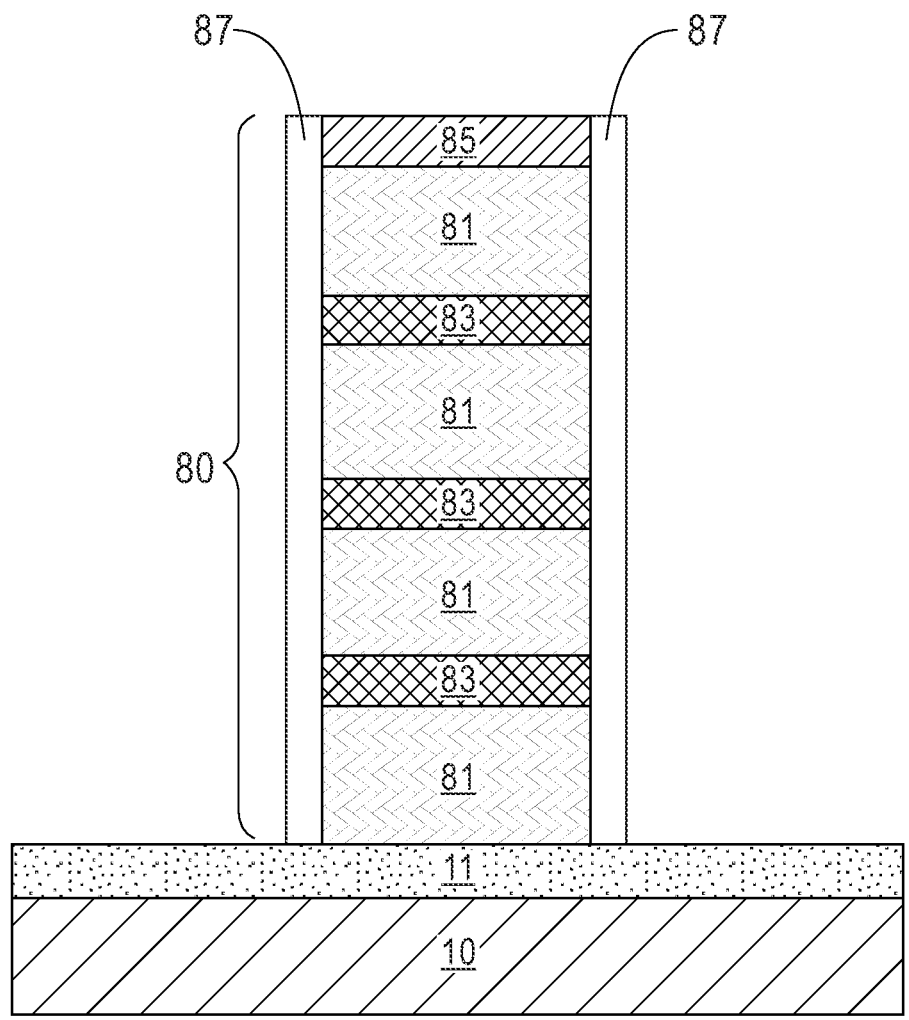
FIG. 12A depicts a cross-sectional view of section B-B of the semiconductor structure after laterally etching a portion of the phase change material, in accordance with the second embodiment of the present invention.

FIG. 12A depicts a cross-sectional view of section A-A of semiconductor structure 1200A after forming spacer 87, in accordance with a second embodiment of the present invention. As depicted, FIG. 12A includes stack 80, spacer 87, HM 85, dielectric layer 11, and substrate 10. Using known sidewall spacer processes, spacer 87 is formed around the vertical sides of stack 80. Specifically, spacer 87 surrounds the exposed sides of sacrificial material 81, PC 83, and HM 85 in stack 80.

Figure 13:
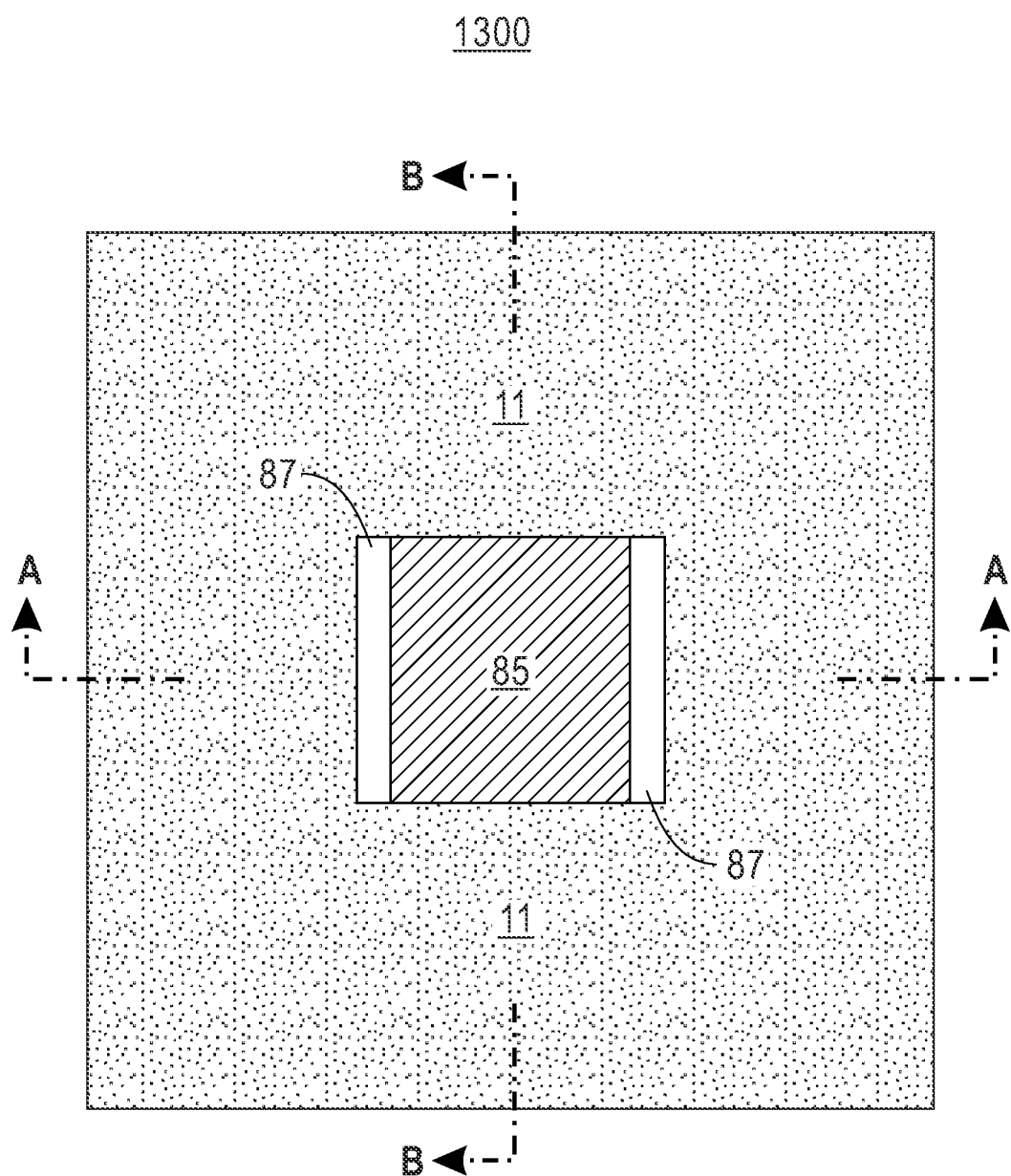
FIG. 13 depicts a top view of the semiconductor structure after depositing an interlayer dielectric (ILD) and etching a portion of the ILD to deposit a dummy electrode, in accordance with the second embodiment of the present invention.

FIG. 13 depicts a top view of semiconductor structure 1300 after etching a portion of stack 80, in accordance with an embodiment of the present invention. As depicted in FIG. 13, portions of HM 85 and spacer 87 are removed, for example, using RIE from the top end and the bottom end of stack 80 along with the portions of stack 80 under the removed HM 85. After etching, a smaller rectangular portion of HM 85 and spacer 87 remain. Spacer 87 remains on the right and left sides of HM 85 but, is not present on along the top and bottom edges of HM 85 in the top view of the semiconductor structure after etching.

Figure 13A:
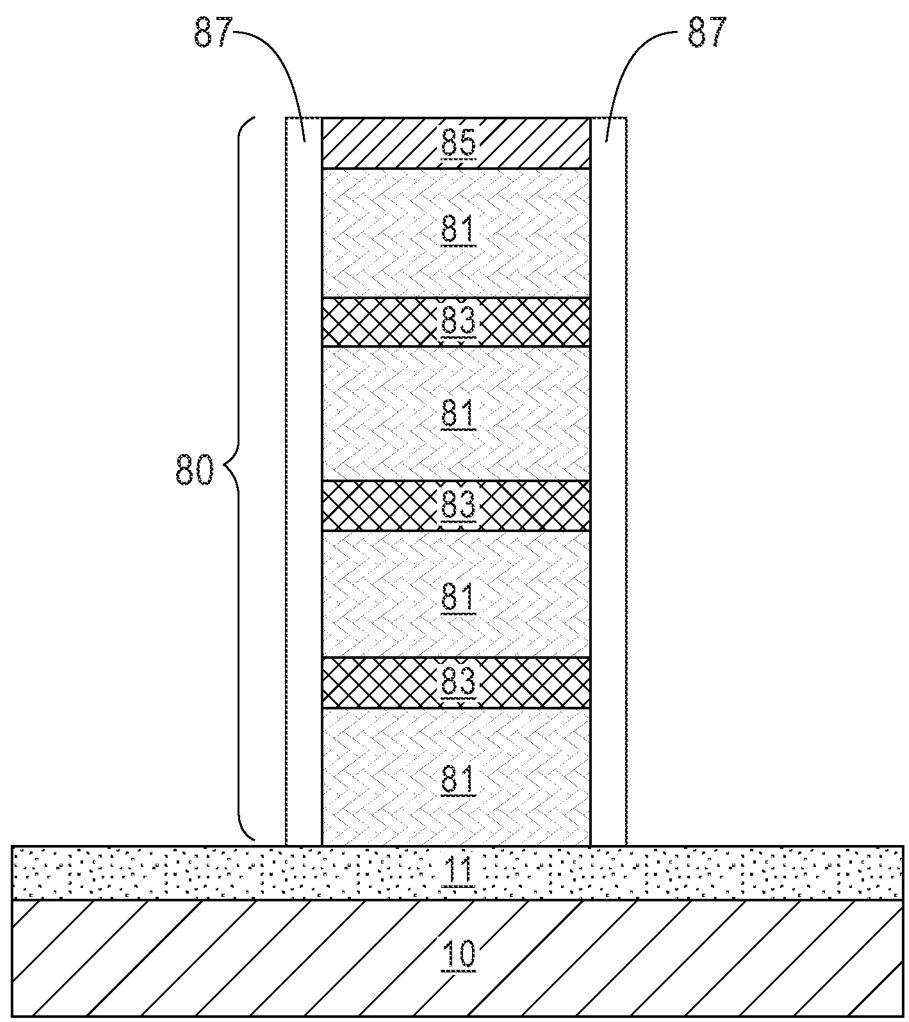
FIG. 13A depicts a cross-sectional view of section A-A of the semiconductor structure after etching the portion of the PCM multilayer stack, in accordance with a second embodiment of the present invention.

FIG. 13A depicts a cross-sectional view of section A-A of semiconductor structure 1300A after etching the portion of stack 80, in accordance with a second embodiment of the present invention. As depicted, FIG. 13A includes stack 80 with spacer 87 on dielectric layer 11. The cross-sectional view of section A-A is essentially the same as the cross-sectional view of section A-A in FIG. 12A.

Figure 14:
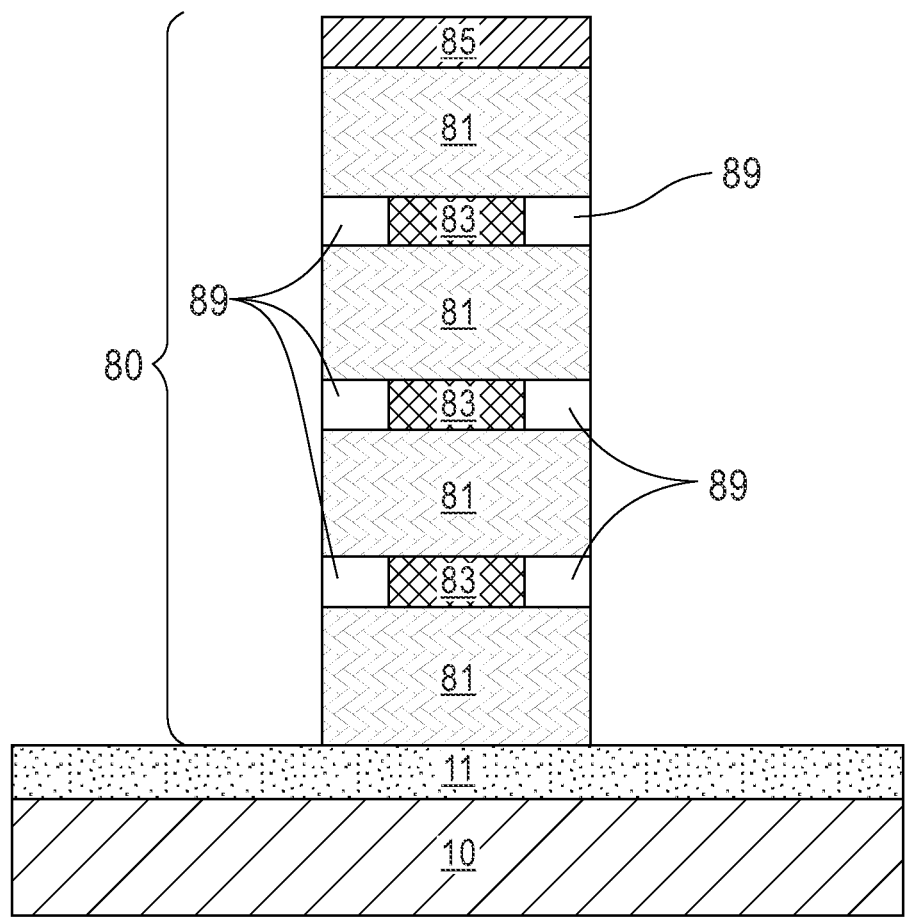
FIG. 14 depicts a cross-sectional view of section B-B of the semiconductor structure after laterally etching a portion of each layer of the phase change material and deposition of a dielectric material, in accordance with the second embodiment of the present invention

FIG. 14 depicts a cross-sectional view of section B-B of semiconductor structure 1400 after laterally etching the exposed edge portion of each layer of PC 83 and deposition of dielectric 89, in accordance with the second embodiment of the present invention. An isotropic etch of each layer of PC 83 can remove a portion of PC 83 from each exposed edge of each layer of PC 83. Where spacer 87 was removed from stack 80 as depicted in FIG. 13, edges of PC 83, sacrificial material 81, and HM 87 can be exposed along the vertical sides of stack 80. A selective isotropic etch of the exposed edges of PC 83 removes a portion of PC 83 from each side of stack 80 in FIG. 14 creating notches or indentations in stack 80.

After the lateral etching of the edge portions of each layer of PC 83, a conformal deposition process (e.g., CVD, etc.) deposits a layer of dielectric 89 in the notches in each layer of PC 83 and over HM 85, stack 80, and dielectric layer 11. An etch back process removes dielectric 89 from the vertical sides of stack 80, HM 85, and dielectric layer 11. After lateral etch of PC 83, dielectric 89 deposition, and etch back of dielectric 89, each vertical edge of the remaining portion of PC 83 is surrounded by dielectric 89. Dielectric 89 is under and above a layer of sacrificial material 81 and abutting the remaining portion of each layer of PC 83.

In some embodiments, the lateral etching of PC 83 and deposition of dielectric 89 do not occur. As previously stated, the shape of the phase change material segments formed from the layers of PC 83 can be different. As depicted, each segment or portion of a layer of PC 83 can be a thin rectangular shape or in other embodiments, the segment or portion of each PC 83 layer can be thick forming a square-like or symmetrical PC 83 segment in stack 80. When the segments of PC 83 are thin rectangles, the phase change material in the top and bottom layers of PC 83 may transition first however, when the segments of PC 83 are square-like or more symmetrical then, the lateral etch and dielectric 89 fill may not be required.

Figure 15:
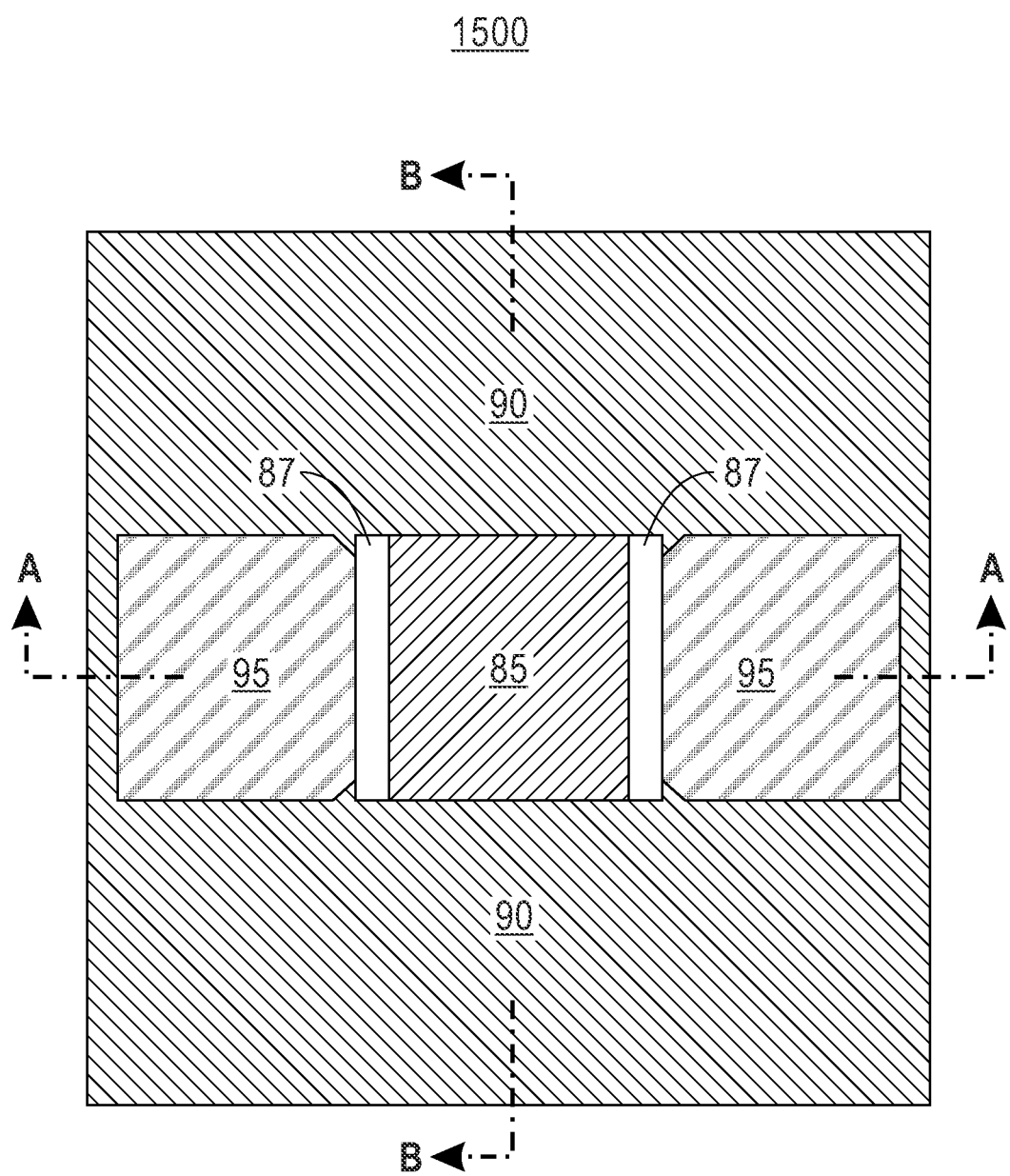
FIG. 15 depicts a top view of the semiconductor structure after depositing and patterning a dummy electrode material, in accordance with the second embodiment of the present invention.

FIG. 15 depicts a top view of semiconductor structure 1500 after depositing and patterning dummy switch electrodes 95, in accordance with the second embodiment of the present invention. As depicted, FIG. 15 includes ILD 90, dummy switch electrodes 95, spacer 87, and HM 85. A layer of a dummy electrode material, such as amorphous silicon, is deposited over semiconductor structure 1500. The dummy electrode material may be patterned and etched to form two dummy switch electrodes 95.

A layer of interlayer dielectric (ILD) 90 can be deposited over semiconductor structure 1500 after forming dummy electrodes 95 and a chemical mechanical polish (CMP) may be performed. The CMP can stop on HM 85 removing excess portions of dummy electrode 95 material from the top surfaces of HM 85, spacer 87, and ILD 90.

Figure 15A:
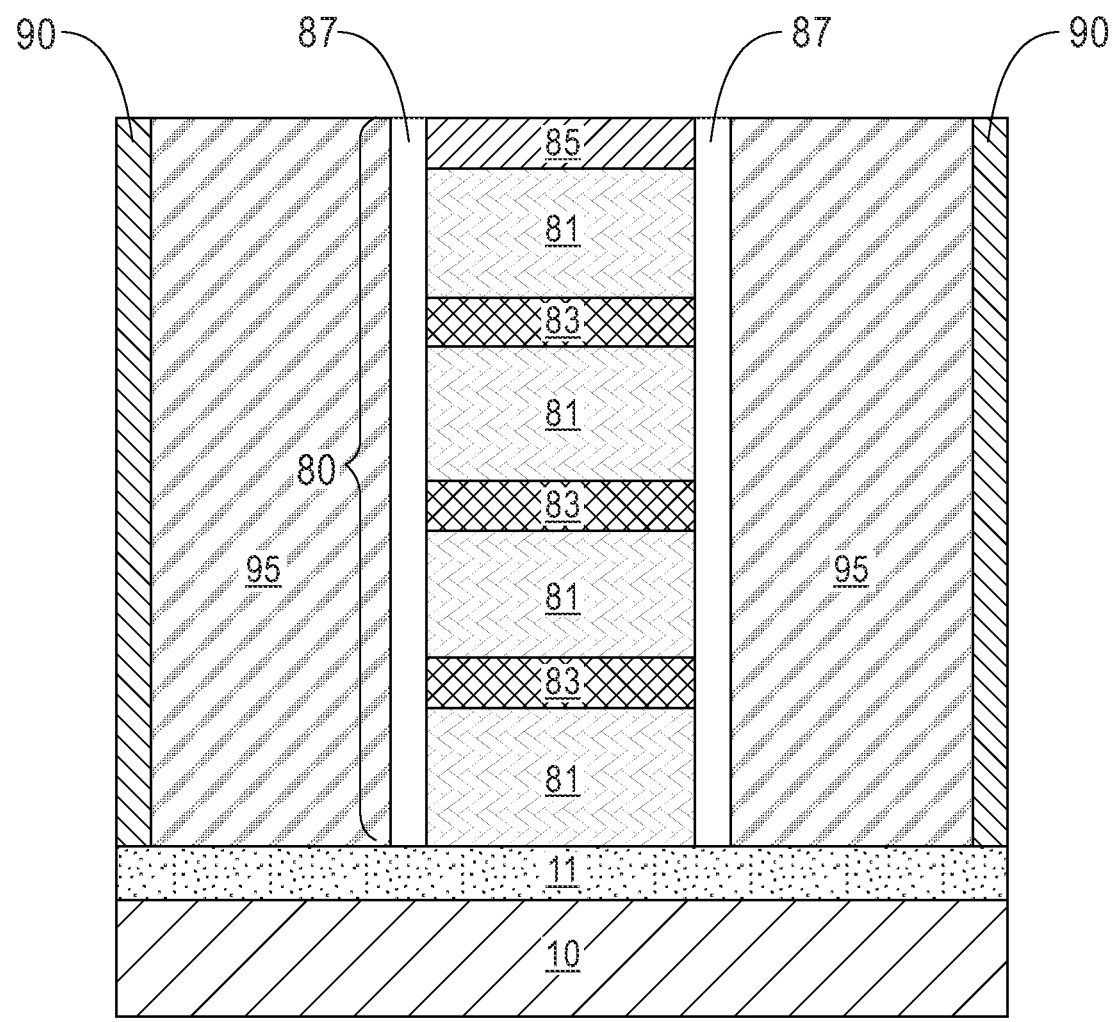
FIG. 15A depicts a cross-sectional view of section A-A of the semiconductor structure after patterning the dummy switch electrode and depositing an interlayer dielectric (ILD), in accordance with the second embodiment of the present invention.

FIG. 15A depicts a cross-sectional view of section A-A of semiconductor structure 1500A after patterning dummy switch electrode 95 and depositing interlayer dielectric (ILD) 90, in accordance with the second embodiment of the present invention. As depicted, FIG. 15A includes stack 80, spacer 87, HM 85, switch dummy electrodes 95, and ILD 90. Dummy switch electrodes 95 reside on the left and right side of stack 80. Dummy switch electrodes 95 each directly abuts ILD 90 on outer edges and spacer 87 on inside edges along the vertical sides of stack 80.

Dummy switch electrode 95 can be patterned and selectively etched. After selectively etching dummy switch electrode 95, ILD 90 can be deposited over semiconductor structure 1500A. A polish of the top surface of semiconductor structure 1500A can remove excess ILD 90. The top surfaces of ILD 90, spacer 87, and dummy electrode 95 can be level after CMP.

Figure 16:
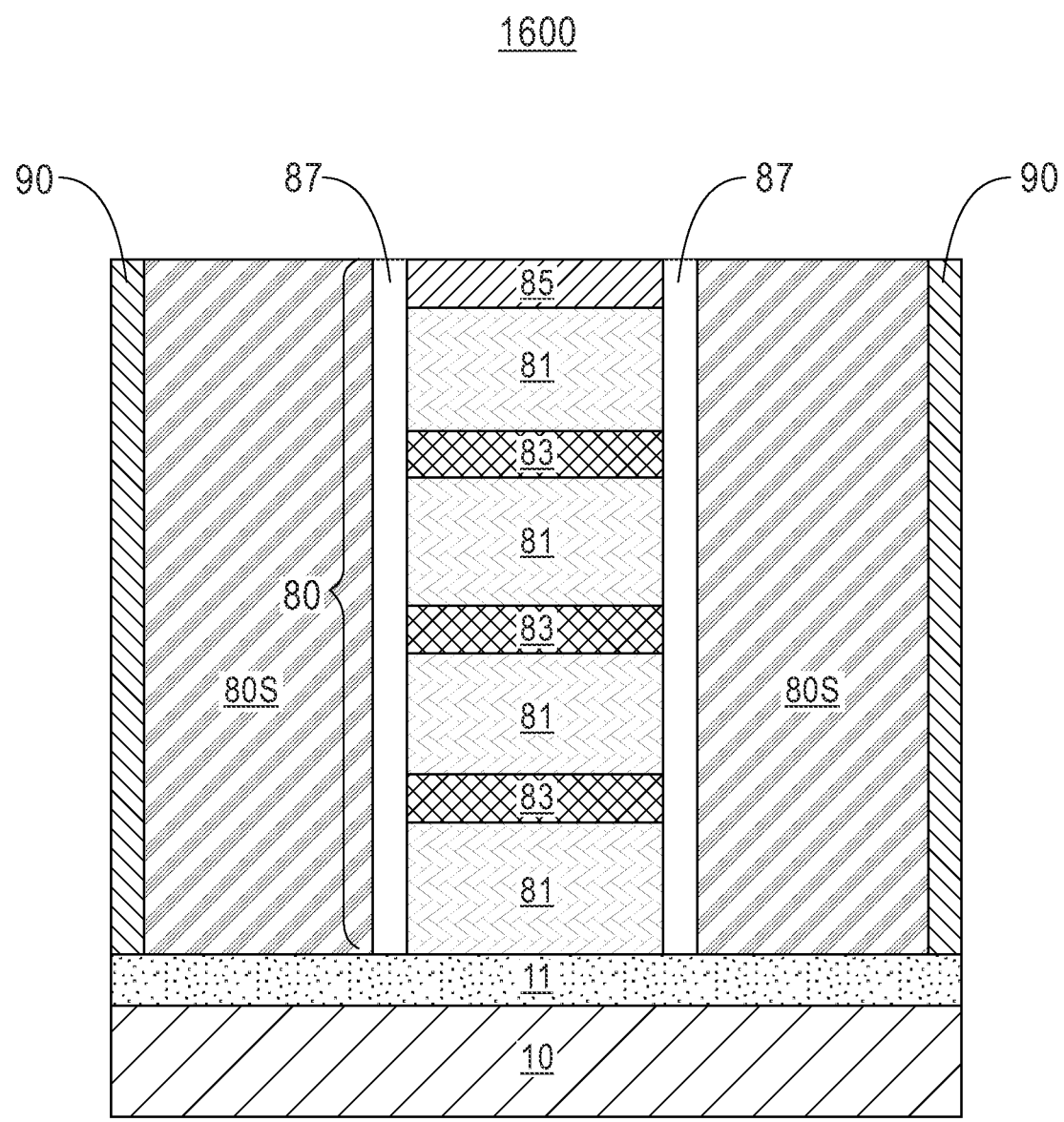
FIG. 16 depicts a top view of the semiconductor structure after removing a portion of the ILD and depositing a dummy heater electrode, in accordance with the second embodiment of the present invention.

FIG. 16 depicts a cross-sectional view of section A-A of semiconductor structure 1600 after removing dummy switch electrodes 95 and depositing switch electrodes 80S, in accordance with the second embodiment of the present invention. As depicted, FIG. 16 includes ILD 90, switch electrodes 80S, spacer 87, HM 85, and stack 80 on dielectric layer 11. FIG. 16 is essentially the same as FIG. 15 except that dummy switch electrodes 95 are replaced with switch electrodes 80S. A selective etch of dummy switch electrodes 95 occurs, followed by deposition of switch electrodes 80S in the cavity created by the removal of dummy switch electrodes 96. The deposition of an electrically conductive electrode material over semiconductor structure 1600 can occur. The electrode material deposits on exposed portions of dielectric layer 11, abutting the vertical sides of ILD 90, HM 85, and spacer 87. A CMP stopping at HM 85 may be performed after the deposition of the electrode material to form switch electrodes 80S.

Figure 17:
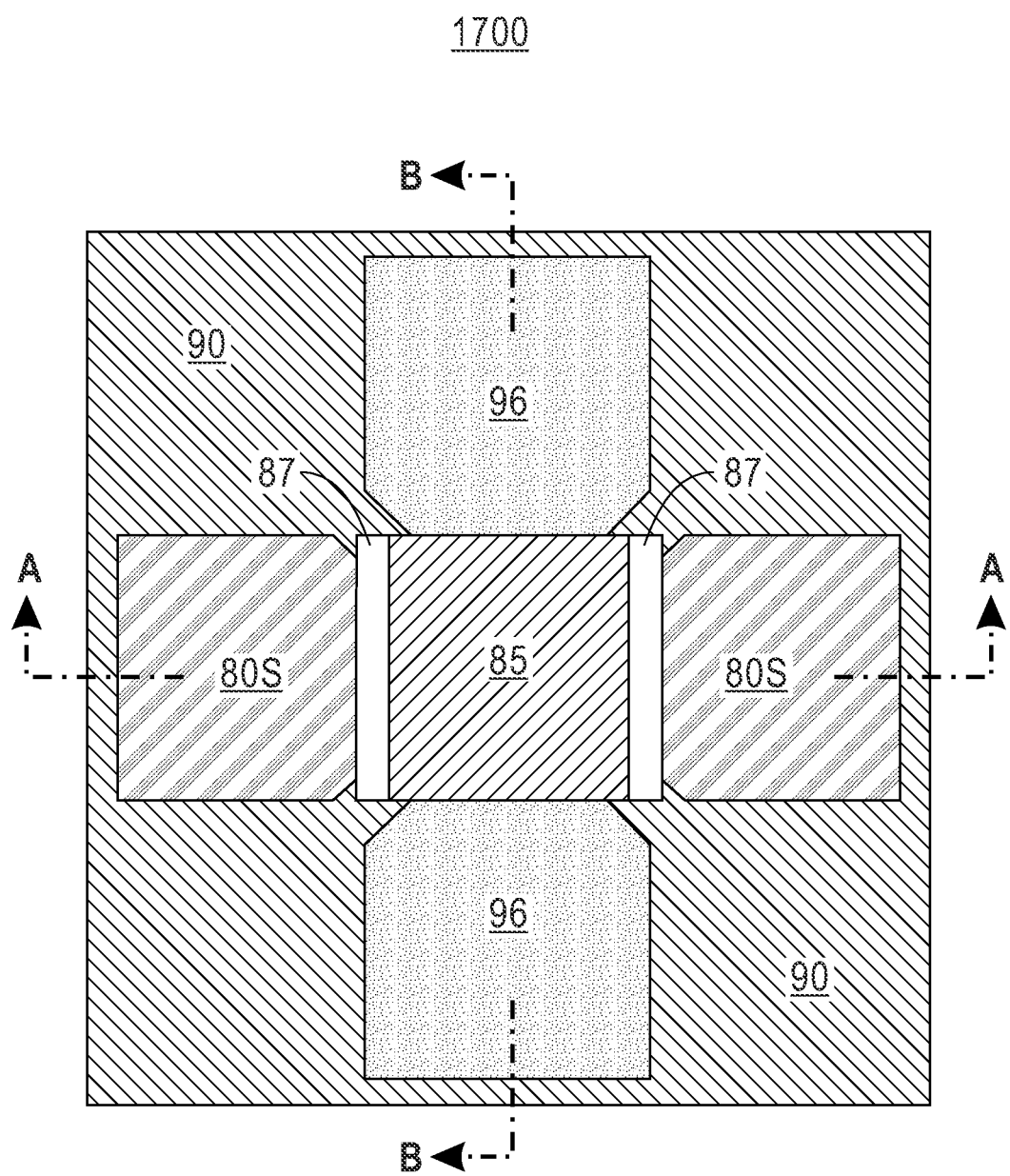
FIG. 17 depicts a cross-sectional view of section A-A of the semiconductor structure after removing the dummy heater electrode metal, in accordance with the second embodiment of the present invention.

FIG. 17 depicts a top view of semiconductor structure 1700 after removing a portion of ILD 90 and depositing dummy heater electrode 96, in accordance with the second embodiment of the present invention. As depicted, FIG. 17 includes ILD 90, spacer 87, HM 85, switch electrodes 80S, and dummy heater electrodes 96. A CMP may be performed on the top surface of dummy heater electrode 96 stopping on HM 85. Dummy heater electrode 96 can be the same or different material as dummy switch electrode 95. For example, dummy heater electrode 96 can be an amorphous silicon. As depicted in FIG. 17, spacer 87 does not contact dummy heater electrodes 96 nor will spacer 87 contact heater electrode 80C when completed (in FIG. FIG. 22). A six sized shape of dummy heater electrodes 96 abutting the top of HM 85 prevents contact of spacer 87 and dummy heater electrodes 96. Similarly, the six sized structure of switch electrodes 80S can prevent contact with dummy heater electrodes 96. The shape of dummy heater electrodes 96 may be different in other examples as long as contact with spacer 87 or switch electrodes 80S does not occur. For example, dummy heater electrode 96 may contact less of HM 15 or may contact more of HM 15.

Figure 17A:
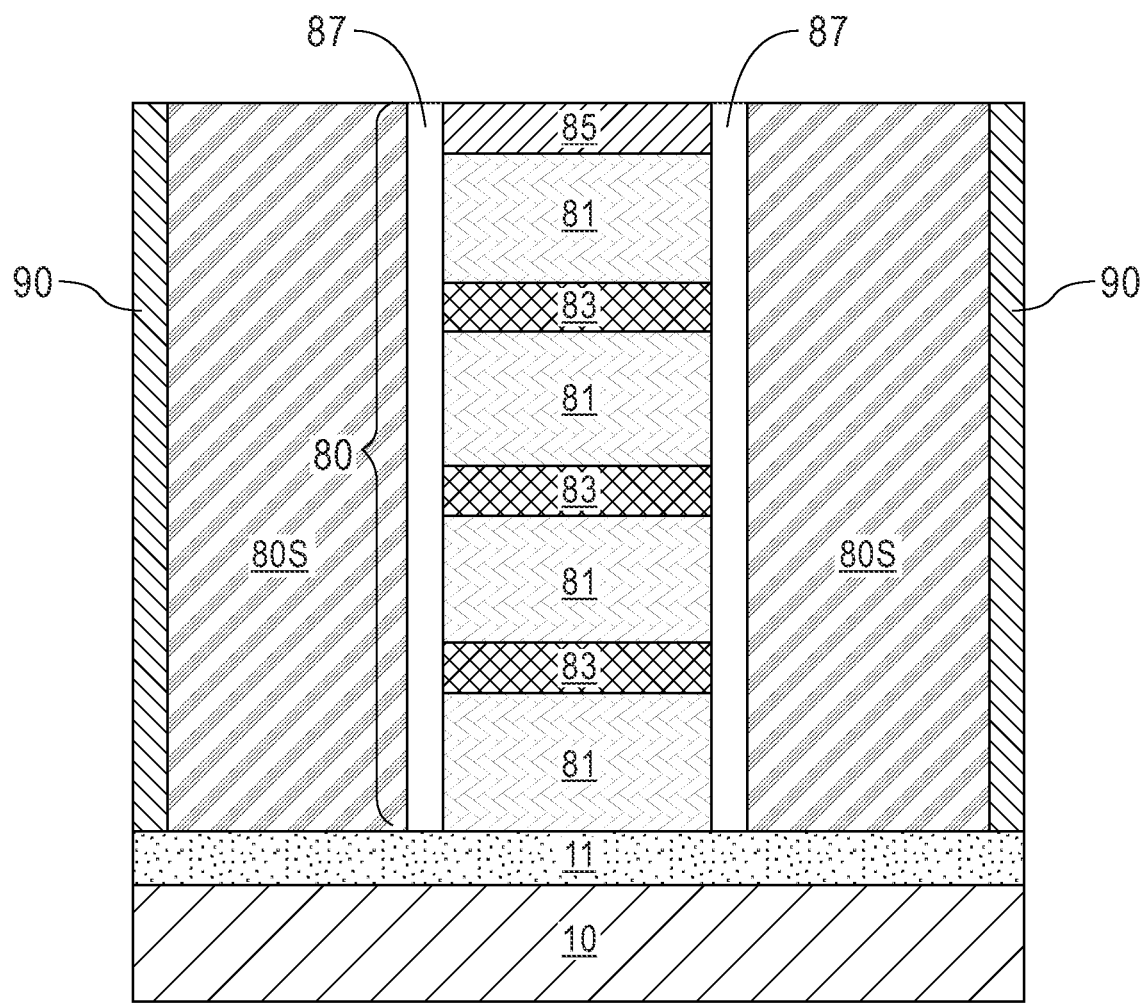
FIG. 17A depicts a cross-sectional view of section B-B of the semiconductor structure after removing a portion of the ILD material and depositing a dummy heater electrode 96, in accordance with the second embodiment of the present invention.

FIG. 17A depicts a cross-sectional view of section A-A of semiconductor structure 1700A after removing a portion of ILD 90 and depositing dummy heater electrode 96, in accordance with the second embodiment of the present invention. As depicted, FIG. 17A includes ILD 90, spacer 87, switch electrode 80S, and stack 80 over dielectric layer 11. A CMP may be performed on the top surface of dummy heater electrode 96 stopping on HM 85.

Figure 18:
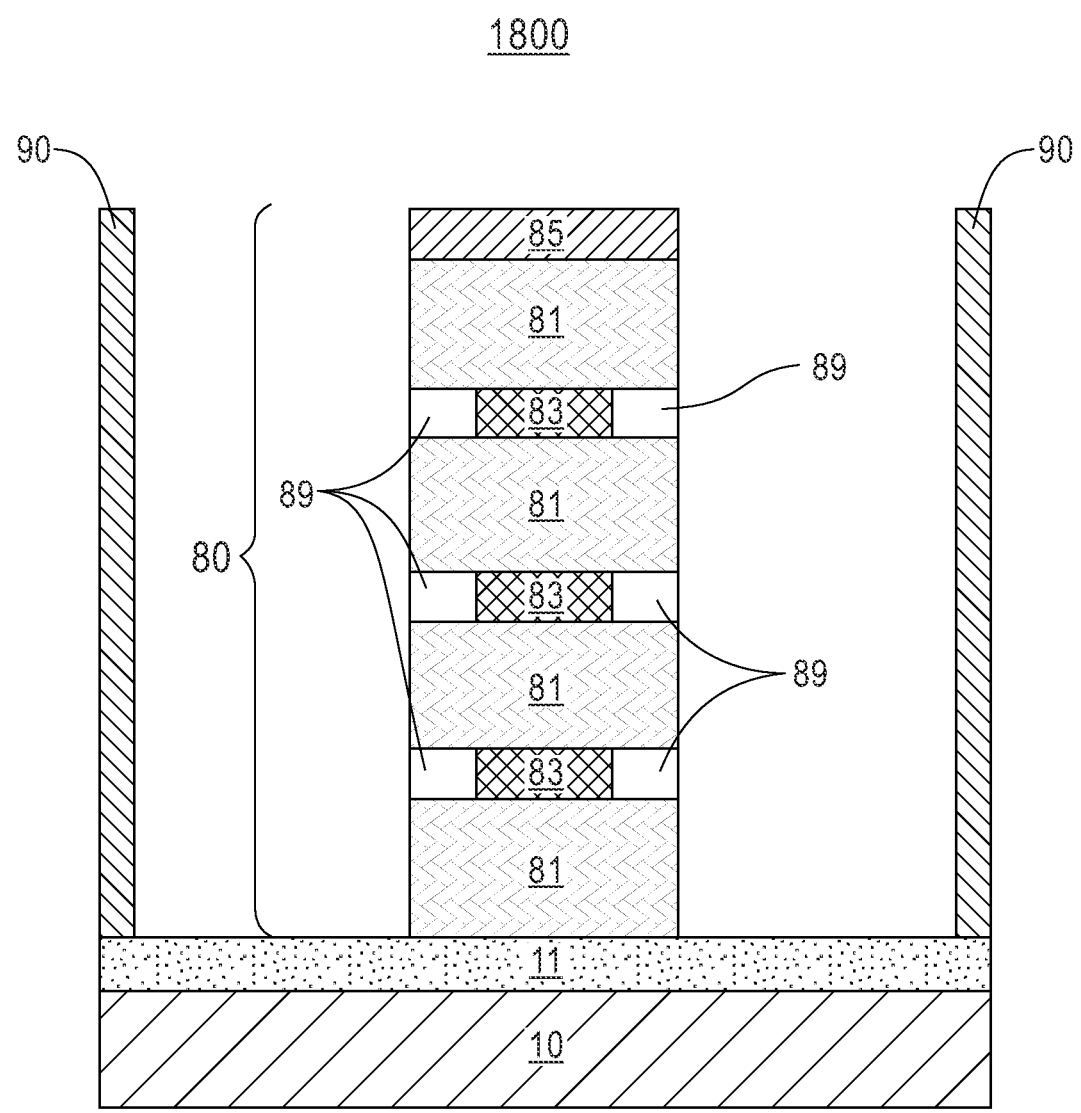
FIG. 18 depicts a cross-sectional view of section B-B of the semiconductor structure after removing the sacrificial dielectric material and the dummy heater electrode, in accordance with the second embodiment of the present invention.

FIG. 18 depicts a cross-sectional view of section B-B of semiconductor 1800 structure after removing dummy heater electrode 96, in accordance with the second embodiment of the present invention. As depicted, FIG. 18 includes ILD 90 and stack 80 on dielectric layer 11. A cavity can be created around stack 80 with the etch of dummy heater electrode 96.

Figure 19:
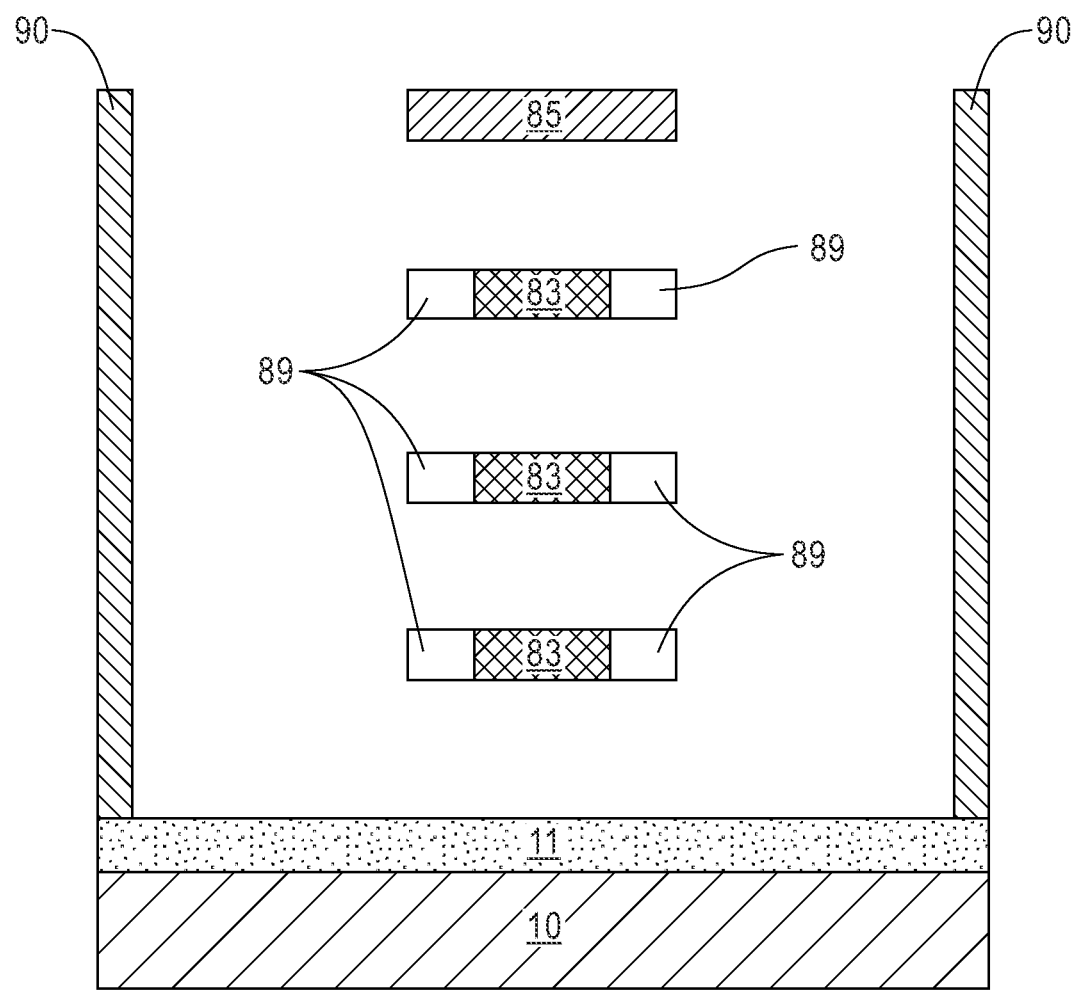
FIG. 19 depicts a cross-sectional view of section B-B of the semiconductor structure after conformally depositing an insulator material on the PCM structure, conformally depositing a layer of heater material surrounding the insulator material, and depositing a heater electrode material, in accordance with the second embodiment of the present invention.

FIG. 19 depicts a cross-sectional view of section B-B of semiconductor structure 1900 after a selective etch of sacrificial material 81, in accordance with the second embodiment of the present invention. Using known selective semiconductor etch processes, such as a wet chemical etch, for example, each layer of sacrificial material 81 can be removed from stack 80. As depicted, FIG. 19 includes ILD 90 on dielectric layer 11 and the remaining layers of PC 83 surrounded by dielectric 89 and HM 85 of stack 80.

Figure 20A:
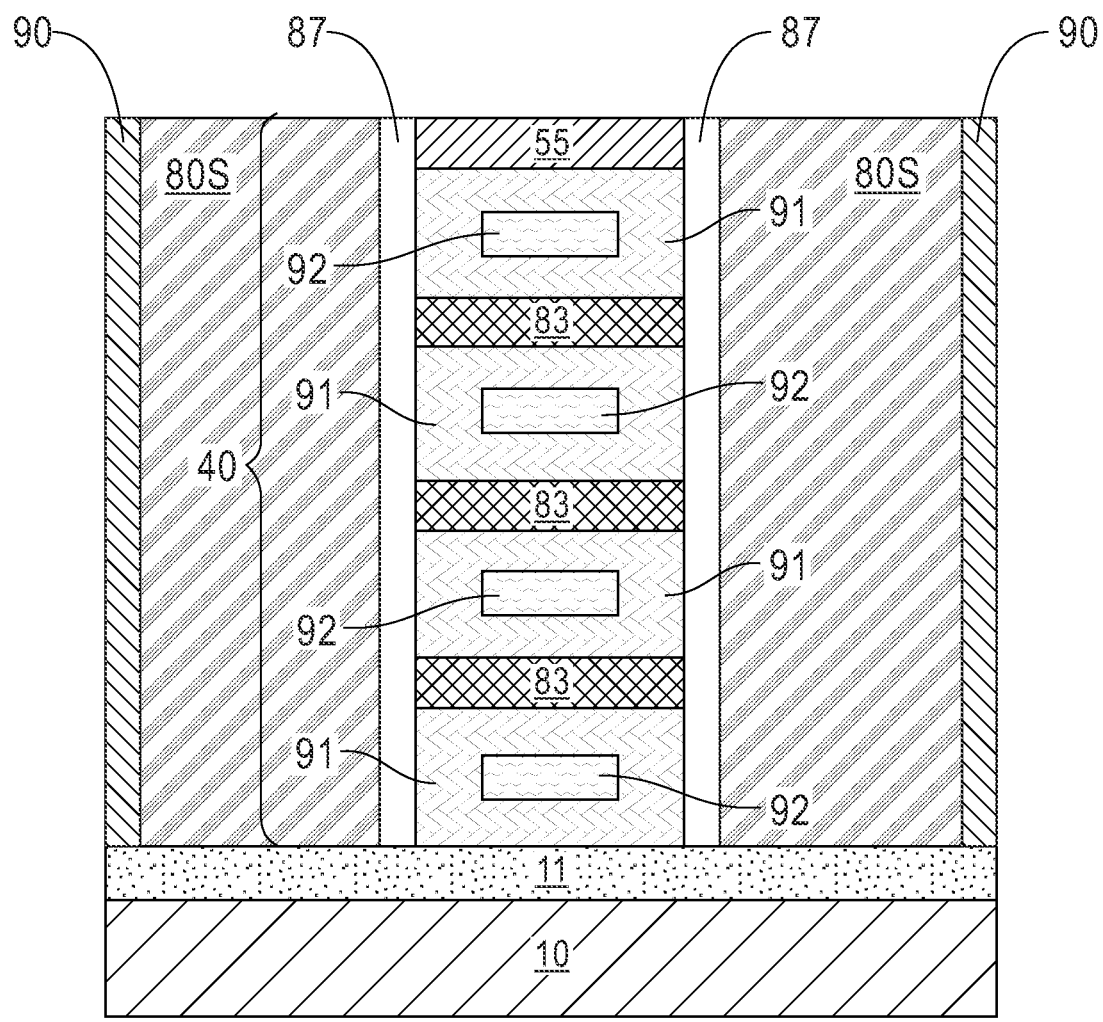
FIG. 20A depicts a cross-sectional view of section A-A of the semiconductor structure after conformally depositing an insulator material and a heater material, in accordance with the second embodiment of the present invention.

FIG. 20A depicts a cross-sectional view of section A-A of semiconductor structure 2000A after depositing insulator 91 and heater 92, in accordance with the second embodiment of the present invention. As depicted, FIG. 20A includes the two switch electrodes 80S that directly abut spacer 87 on inside vertical surfaces and directly abut ILD 90 on outside vertical surfaces, a top layer of HM 85 on alternating layers of insulator 91 and heater 92 all above dielectric layer 11 on substrate 10. In FIG. 20A, each layer or segment of heater 92 is surrounded by a thin layer of insulator 91 and the edges of each layer of PC 43 directly contact spacer 87 which is an electrically conductive material. In this way, each layer of PC 43, when in a low resistance crystalline state, can transmit signals, such as an RF signal, in semiconductor structure 2000A.

Figure 20B:
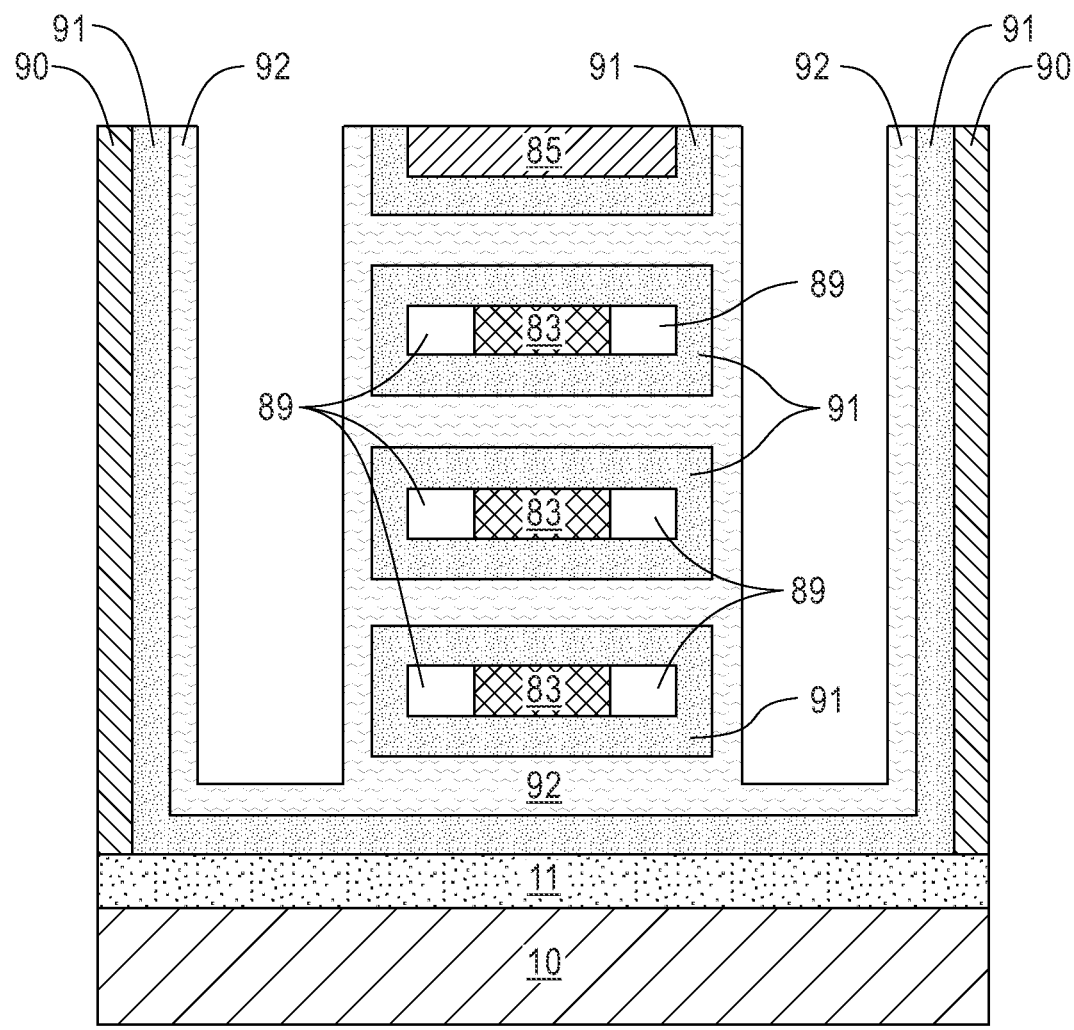
FIG. 20B depicts a cross-sectional view of section B-B of the semiconductor structure after conformally depositing the insulator material and the heater material, in accordance with the second embodiment of the present invention.

FIG. 20B depicts a cross-sectional view of section B-B of semiconductor structure 2000B after depositing insulator 91 and heater 92, in accordance with the second embodiment of the present invention. A conformal deposition of an electrically insulating, but thermally conductive material, such as aluminum nitride (AlN) or hexagonal boron nitride for insulator 91 occurs. The conformal deposition of insulator 91 surrounds HM 85, each of PC 83 with dielectric 89 abutting the vertical edges of PC 83, and is over the exposed surfaces of dielectric layer 11 and ILD 90. The insulator 91 can be deposited on the top surface of HM 85 and ILD 90 but, is not shown and will be removed during a later CMP process.

A second conformal deposition occurs to deposit a layer of the heater material, such as but not limited to, TiN for heater 92 on the exposed surfaces of insulator 91. For example, heater 92 can be deposited on insulator 91. Specifically, heater 92 resides on the vertical sides of insulator 91 on ILD 90 and the vertical sides of insulator on dielectric 89. As depicted, heater 92 also resides on the horizontal surfaces of insulator 91 dielectric layer 11 and between stacked layers of PC 83 with dielectric 89 on the ends of PC 83. The conformal deposition of heater 92 pinches off the gaps between horizontal sections of insulator 91. After the two conformal depositions, a cavity is present adjacent to heater 92 on insulator 91 on the vertical sides of ILD 90 (e.g., a cavity between heater 92 on the stack of PC 43 materials and heater 92 parallel to ILD 90).

Figure 21:
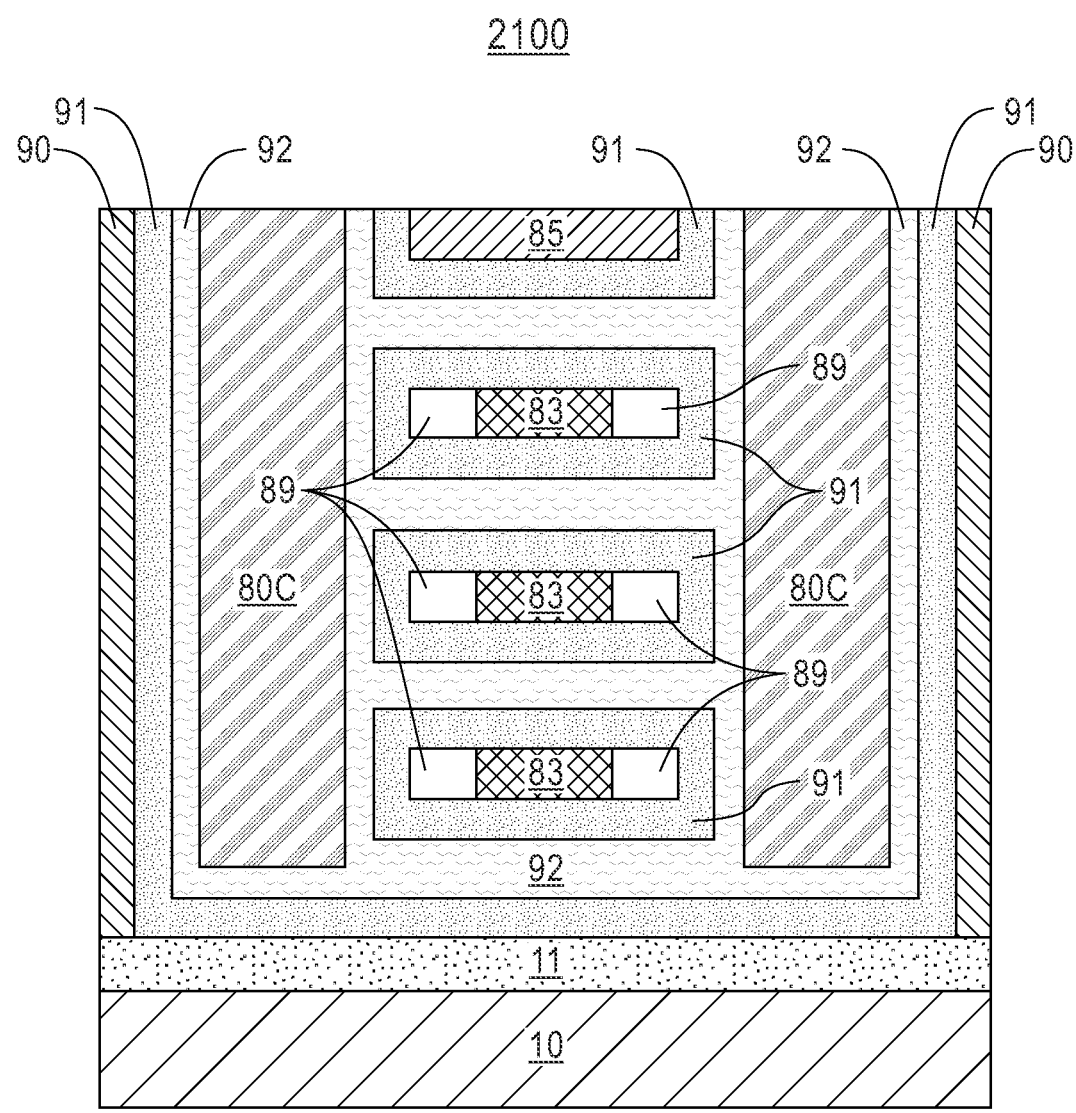
FIG. 21 depicts a cross-sectional view of section B-B of the semiconductor structure after depositing a heater electrode material, in accordance with the second embodiment of the present invention.

FIG. 21 depicts a cross-sectional view of section B-B of semiconductor structure 2100 after depositing heater electrode 80C, in accordance with the second embodiment of the present invention. A deposition of an electrode material, such as tungsten (W), but not limited to tungsten, can occur filling the remaining portion of the cavity created by the removal of dummy heater electrode 96 previously discussed regarding FIG. 18. Heater electrode 80C can be deposited over semiconductor structure 2100. The deposition of heater electrode 80C over heater 92 in deposited in the cavity in FIG. 20 fills the cavity and covers the top surface of semiconductor structure 2100. A CMP can be performed stopping on HM 85. The CMP removes excess heater electrode 80C material from the top surfaces of ILD 90, insulator 91, heater 92, and HM 85.

In an embodiment, the CMP does not occur or stops before HM 85, a selective etch of the top surface of semiconductor structure 2100 selectively removes a top portion heater electrode 80C from insulator 91, heater 92, switch electrodes 80S (not depicted), and from portions of HM 85 and spacer 87. The selective etch leaves a portion of heater electrode 80C on a top portion of HM 85 and a top portion of spacer 87 (e.g., similar to FIG. 10B).

Figure 22:
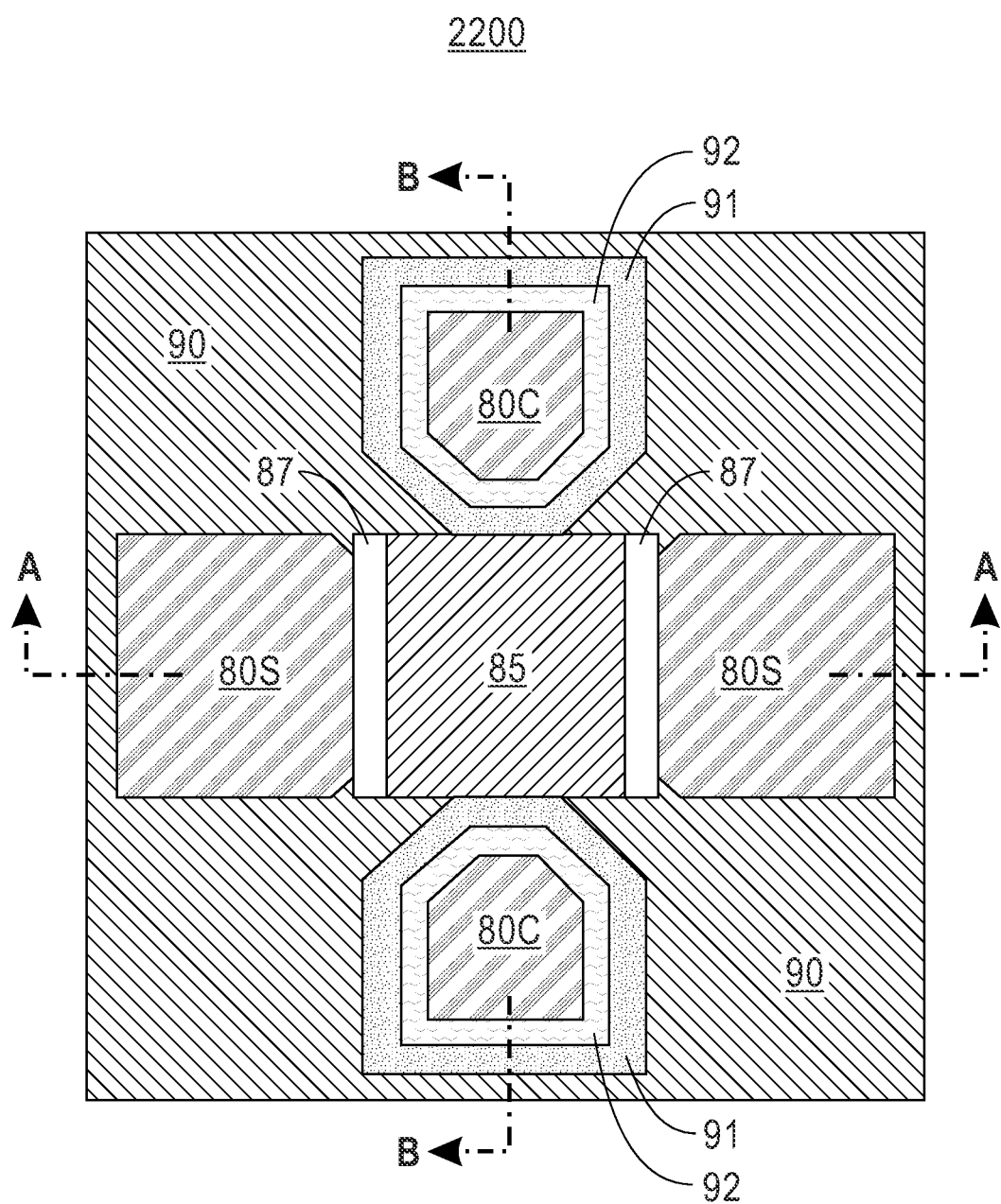
FIG. 22 depicts a top view of the semiconductor structure after depositing heater electrode, in accordance with the second embodiment of the present invention.

FIG. 22 depicts a top view of semiconductor structure 2200 after depositing heater electrode 80C, in accordance with the second embodiment of the present invention. As depicted, FIG. 22 includes ILD 90, a portion of HM 85, a portion of spacer 87, insulator 91, switch electrode 80S, and heater electrode 80C that is surrounded by heater 92 and insulator 91. Heater 92 can have heater electrode 80C inside and insulator 91 outside heater 92. As depicted, semiconductor structure 2200 provides two switch electrodes 80S on opposite sides of semiconductor structure 2200 and two heater electrodes 80C that are depicted above and below each other for a four terminal switching device using stacked layers of PC 43 alternating with thin layers of insulator 91 and heater 92 under HM 85 where heater 92 directly contacts heater electrodes 80C. Switch electrodes 80S directly abut or contact spacer 87 (e.g., a metal sidewall spacer). Heater electrodes 80C directly contact heater 92 which is surrounded by insulator 91. As depicted, a portion of the edges of the top surface of HM 85 directly contacts a portion of heater 92 surrounding the two heater electrodes 80C. The top surfaces of Hm 85, switch electrodes 80S, heater electrodes 80C, ILD 90, spacer 87, heater 92, and insulator 91 are level in the top view of the PCM switching device of the present invention with four electrodes.

While the invention has been shown and described with reference to certain exemplary embodiments thereof, it will be understood by those skilled in the art that various changes in form and details may be made therein without departing from the spirit and scope of the present invention as defined by the appended claims and their equivalents.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. A semiconductor structure comprising:
a multiple layer phase change material stack is on a portion of a first dielectric material on a semiconductor substrate;
a sidewall spacer is on two opposing sides of the multiple layer phase change material stack contacting an edge of each layer of a phase change material in the multiple layer phase change material stack and portions of an electrically insulating and thermally conductive material surrounding a heater material in the multiple phase change material stack;
a pair of a first type of electrode, wherein each of the pair of the first type of electrode directly abuts each of the sidewall spacers on the two opposing sides of the multiple layer phase change material stack; and
a pair of a second type of electrode, wherein each of the pair of the second type of electrode directly abuts each of two other opposing sides of the multiple layer phase change material stack and contacts the heater material on outside portions of the multiple layer phase change material stack.

2. The semiconductor structure of claim 1, wherein the multiple layer phase change material stack is composed of alternating layers of the heater material, the electrically insulating and thermally conductive material, and the phase change material.

3. The semiconductor structure of claim 1, wherein the multiple layer phase change material stack has a rectangular shape with the sidewall spacer on the two opposing sides of the multiple layer phase change material stack.

4. The semiconductor structure of claim 1, wherein each of the pair of the first type of electrode abuts each of the sidewall spacers on the two opposing sides of the multiple layer phase change material stack to electrically connect through the sidewall spacers with an edge of each layer of the phase change material in the multiple layer phase change material stack, and wherein the sidewall spacers are composed of an electrically conductive material.

5. The semiconductor structure of claim 1, wherein each of the pair of the first type of electrode transmits a signal in the semiconductor structure in a layer of the phase change material in a crystalline state.

6. The semiconductor structure of claim 1, wherein each of the pair of the first type of electrode does not transmit a signal in the semiconductor structure in a layer of the phase change material is in an amorphous state.

7. The semiconductor structure of claim 1, wherein the pair of the second type of electrode contacts each layer of the heater material and portions of the electrically insulating and thermally conductive material.

8. The semiconductor structure of claim 7, wherein each layer of the heater material provides thermal energy through the electrically insulating and thermally conductive material to each layer of the phase change material in the multiple layer phase change material stack.

9. The semiconductor structure of claim 8, wherein each layer of the heater material provides thermal energy through the electrically-insulating and thermally conductive material to create a crystalline atomic structure in the phase change material in the multiple layer phase change material stack.

10. The semiconductor structure of claim 9, wherein the pair of the first type of electrode transmits a signal in the phase change material with the crystalline atomic structure.

11. The semiconductor structure of claim 2, further comprises a dielectric material directly abutting the pair of the second type of electrode and two sides of each layer of the phase change material in the multiple phase change material stack.

12. The semiconductor structure of claim 1, wherein the semiconductor structure with the multiple layer phase change material stack, the pair of the first type of electrode, and the pair of the second type of electrodes is a radio frequency switching device.

13. A semiconductor structure comprising:
a multiple layer phase change material stack is on a portion of a dielectric material on a semiconductor substrate;
a sidewall spacer directly abutting two opposing sides of the multiple layer phase change material stack, wherein the sidewall spacer contacts an edge of each layer of a phase change material, an electrically insulating and thermally conductive material surrounding each layer of a heater material, and a top hardmask layer;
a pair of a first type of electrode, wherein each of the pair of the first type of electrode directly contacts each of the sidewall spacers on the two opposing sides of the multiple layer phase change material stack; and
a pair of a second type of electrode surrounded by the heater material connecting to each layer of the heater material in the multiple layer phase change material stack.

14. The semiconductor structure of claim 13, wherein the multiple layer phase change material stack is composed of a layer of the electrically insulating and thermally conductive material above and below each layer of the phase change material, the heater material above and below the electrically insulating and thermally conductive material and directly contacting the pair of the second type of electrode, and wherein the top hardmask layer is on the multiple layer phase change material stack.

15. The semiconductor structure of claim 13, wherein each layer of the phase change material in the multiple layer phase change material stack includes a dielectric material on two outside edges of each layer of the phase change material abutting the pair of the second type of electrode material.

16. The semiconductor structure of claim 13, wherein the heater material connecting to each layer of the heater material in the multiple layer phase change material stack further comprises the heater material surrounding the pair of the second type of electrode and abutting a layer of the electrically insulating and thermally conducting material.

17. The semiconductor structure of claim 13, wherein the multiple layer phase change material stack with the pair of a first type of electrode and the pair of a second type of electrode is a four terminal switching device.

18. The semiconductor structure of claim 13, wherein the pair of the first type of electrode transmits a signal in the semiconductor structure in each layer of the phase change material that is in a crystalline state.

19. The semiconductor structure of claim 13, wherein the sidewall spacer is composed of an electrically conductive material.

* * * * *